United States Patent [19]

Shibuya

[11] Patent Number: 5,579,237
[45] Date of Patent: Nov. 26, 1996

[54] METHOD OF DESIGNING A CELL PLACEMENT OF AN INTEGRATED CIRCUIT

[75] Inventor: Toshiyuki Shibuya, Kawasaki, Japan

[73] Assignee: Fujitsu Limited, Kawasaki, Japan

[21] Appl. No.: 339,211

[22] Filed: Nov. 10, 1994

[30] Foreign Application Priority Data

Nov. 15, 1993 [JP] Japan ................................. 5-284682

[51] Int. Cl.[6] ...................................................... G06F 17/10
[52] U.S. Cl. ............................................. 364/491; 364/490
[58] Field of Search ..................................... 364/488, 489, 364/490, 491

[56] References Cited

U.S. PATENT DOCUMENTS

| | | | |
|---|---|---|---|
| 4,577,276 | 3/1986 | Dunlop et al. | 364/491 |
| 4,593,363 | 6/1986 | Burstein et al. | 364/491 |
| 5,113,352 | 5/1992 | Finnerty | 364/490 |
| 5,144,563 | 9/1992 | Date et al. | 364/489 |
| 5,159,682 | 10/1992 | Toyonaga et al. | 395/500 |
| 5,189,784 | 2/1993 | Rowson | 395/500 |
| 5,224,056 | 6/1993 | Chene et al. | 364/490 |
| 5,224,057 | 6/1993 | Igarashi et al. | 364/490 |
| 5,257,201 | 10/1993 | Berman et al. | 364/489 |
| 5,267,176 | 11/1993 | Antreich et al. | 364/491 |
| 5,308,798 | 5/1994 | Brasen | 364/490 |
| 5,349,536 | 10/1994 | Ashtaputre et al. | 364/490 |
| 5,359,538 | 10/1994 | Hui et al. | 364/489 |

OTHER PUBLICATIONS

Yang et al., "Two-level partioning algorithm with stable performance", IEEE Proc. Circuit Dev. Sys., vol. 14, No. 3, Jun. 1994, p. 197–202.

Tragoudas, "An Improved Algorithm for the Generalized Min–Cut partitioning Problem", IEEE 1994, p. 242–247.

Shin et al., "A Simple Yet Effective Technique for Partitioning", IEEE Trans on VLSI Sys, vol. 1, No. 3, Sep. 1993, pp. 380–386.

Cheng et al., "An Improved Two–Way Partitioning Algorothm with Stable Performance", IEEE Trans on CAD, vol. 10, No. 12, Dec. 1991, p. 1502–1511.

Tragoudas, "Min Max–Cut Graph Partitioning problems" IEEE 1993, pp. 100–104.

Zhou et al., "An Asymptotically optional Algorithm for Gate Array Placement", IEEE 1993, pp. 95–98.

Sriram et al., "A Parallel Min–Cut Technique for Standard Cell Placement Using Modified Hopfield Neural Network", China 1991 Int'l Conf on Circ. & Sys, Jun. 1991, 894–897.

Ball et al., "Fuzzy Partioning applied to VLSI–Floorplanning & Placement", pp. 177–180.

Terai, "A New Min–Cut Placement Algorithm for Timing Assurance Layout Design Meeting Net Length Constraint", IEEE 1990 27th ACM/IEEE DAC, pp. 96–102.

Hill, "Alternative Strategies for Applying Min–Cut to VLSI Placement", IEEE 1988, pp. 440–444.

(List continued on next page.)

Primary Examiner—Kevin J. Teska
Assistant Examiner—Tyrone V. Walker
Attorney, Agent, or Firm—Staas & Halsey

[57] ABSTRACT

An integrated circuit placement method is executed according to a mini-cut method to design the cell placement of an integrated circuit by setting a cut line which divides the integrated circuit into a plurality of blocks and moving the cells such that the cut size, that is, the number of nets, connecting the cells and traversing the cut line can be minimum. It aims to determine the optimum placement by preventing cut size from keeping a local minimum state. A first process P1 detects stable nets which have caused a local minimum state if the cut size in a net has reached the local minimum state after executing the mini-cut method. A second process P2 selects all or a part of the detected stable nets and moves the cells connected to the selected stable nets and placed in different blocks to either of the blocks. A third process P3 detects stable nets if it is determined that the cut size of the net cannot satisfy a terminate condition after executing the mini-cut method immediately following the second process P2, and reactivates the second process P2.

21 Claims, 36 Drawing Sheets

OTHER PUBLICATIONS

Leighton et al., "An Approximate Max–Flow Min–Cut Theorem for Uniform Multicommodity Flow Problems with Applications to Approximation Algorithms", IEEE 1988, pp. 422–431.

Krishnamurthy, "An Improved Min–Cut Algorithm For Partitioning VLSI Networks", IEEE Trans on Computers, vol. 33, No. 5, May 1984, 438–446.

Vijayan, G, "Generalization of Min–Cut Partitioning to Tree Structures and Its Applications", IEEE Trans on Computers, vol. 40, No. 3, Mar. 1991, 307–314.

CUT LINE

CUT LINE

| cell 1 | A |
| --- | --- |
| cell 2 | A |
| cell 3 | B |
| cell 4 | B |
| cell 5 | A |
| cell 6 | A |
| cell 7 | B |
| cell 8 | B |
| cell 9 | A |

| VARIABLE NAME | VARIABLE VALUE |
|---|---|
| cutFlag (1) | 1 |
| cutFlag (2) | 1 |
| cutFlag (3) | 1 |

Fig. 16

| VARIABLE NAME | VARIABLE VALUE |
|---|---|
| stableFlag (1) | 1 |
| stableFlag (2) | 1 |
| stableFlag (3) | 0 |

Fig. 17

| VARIABLE NAME | VARIABLE VALUE |
|---|---|
| moved Flag [1] | 0 |
| moved Flag [2] | 0 |
| moved Flag [3] | 0 |
| moved Flag [4] | 0 |
| moved Flag [5] | 0 |
| moved Flag [6] | 0 |
| moved Flag [7] | 0 |
| moved Flag [8] | 0 |
| moved Flag [9] | 0 |

Fig. 21

| VARIABLE NAME | VARIABLE VALUE |
|---|---|
| stableNetTable (1) . Flag | 0 |
| stableNetTable (2) . Flag | 0 |

Fig. 22

| cell 1 | A |
|---|---|
| cell 2 | A |
| cell 3 | B |
| cell 4 | B |
| cell 5 | A |
| cell 6 | A |
| cell 7 | B |
| cell 8 | B |
| cell 9 | A |

| cell 1 | B |
|---|---|
| cell 2 | B |
| cell 3 | B |
| cell 4 | B |
| cell 5 | A |
| cell 6 | A |
| cell 7 | A |
| cell 8 | A |
| cell 9 | A |

| VARIABLE NAME | VARIABLE VALUE |
|---|---|
| cutFlag (1) | 1 |
| cutFlag (2) | 1 |

Fig. 34

| VARIABLE NAME | VARIABLE VALUE |
|---|---|
| stableFlag (1) | 1 |
| stableFlag (2) | 1 |

Fig. 35

| VARIABLE NAME | VARIABLE VALUE |
|---|---|
| moved Flag (1) | 0 |
| moved Flag (2) | 0 |
| moved Flag (3) | 0 |
| moved Flag (4) | 0 |
| moved Flag (5) | 0 |
| moved Flag (6) | 0 |
| moved Flag (7) | 0 |
| moved Flag (8) | 0 |

Fig. 38

| VARIABLE NAME | VARIABLE VALUE |
|---|---|
| stableNetTable (1) . Flag | 0 |
| stableNetTable (2) . Flag | 0 |

Fig. 39

| cell 1 | A |
| --- | --- |
| cell 2 | A |
| cell 3 | D |
| cell 4 | D |
| cell 5 | C |
| cell 6 | C |
| cell 7 | B |
| cell 8 | B |

| cell 1 | A |
| --- | --- |
| cell 2 | A |
| cell 3 | D |
| cell 4 | D |
| cell 5 | C |
| cell 6 | C |
| cell 7 | B |
| cell 8 | B |

| cell 1 | A |
| --- | --- |
| cell 2 | A |
| cell 3 | B |
| cell 4 | B |
| cell 5 | C |
| cell 6 | C |
| cell 7 | D |
| cell 8 | D |

METHOD OF DESIGNING A CELL PLACEMENT OF AN INTEGRATED CIRCUIT

BACKGROUND OF THE INVENTION

1. Field of the Invention

The present invention relates to an integrated circuit placement method for an integrated circuit, and more specifically to an integrated circuit placement method to obtain an optimum placement when a mini-cut method is applied.

With the remarkable progress of the recent circuit technologies, density of a chip has been strikingly increased and the size of a chip has been enlarged considerably. Thus, the number of cells contained in a chip of an integrated circuit is actively increasing. Therefore, it becomes more and more difficult to obtain an optimum placement in such an integrated circuit. Under the conditions, a new effective placement method is required to obtain the optimum solution.

2. Description of the Related Art

A mini-cut method is used as one of the cell placement algorithms for an integrated circuit. According to the mini-cut method, a cut line is set, and the circuit is divided into blocks so as to minimize number of nets (hereinafter referred to as cut size) that interconnect cells in both blocks. The final cell placement is obtained by repeatedly setting additional cut lines.

According to the mini-cut method, cells are moved between blocks based on the cell-gain concept. A cell-gain is defined as the cut size decreased when the cell is moved to another block.

If a cell encompassed by bold lines as shown in the part (a) of FIG. 1 is moved to another block, then the net to the cell becomes uncut, thereby the cell-gain of the cell is g=1. On the other hand, if a cell shown as being encompassed by fine lines is moved, the net is kept uncut, thereby the cell-gain of the cell is 0. In (c) in FIG. 1, if a cell is moved, the cell-gain is −1 because the cut size is increased.

The mini-cut method has a cell move according to a cell-gain concept to reduce the cut size. Moving a cell and re-evaluating the cell-gain are repeatedly processed until the cut size will not be decreased. However, during the execution of the mini-cut method, if a net remains uncut from the beginning to the end of the process, an achieved stable state is not necessarily optimum, but can be a so-called "local minimum".

FIG. 2 shows an example of such a net. In a state in which a plurality of cells exist on both sides of the cut line the cell-gain does not change, even if a single cell is moved beyond the cut line to another block. If such a net exists in an initial placement, the net possibly remains uncut until the end of the process, and may incur a local minimum.

Conventionally, the initial solution is altered and the mini-cut method is started from the very beginning if it is determined that a stable state achieved by performing the mini-cut method only indicates a local minimum.

However, if the number of cells of an integrated circuit becomes large, then the mini-cut method can result in a local minimum. Therefore, multiple initial solutions are required to obtain better results. There also is a problem that the optimum cell placement cannot be obtained due to repeated local minimums determined however often the initial placement may be altered.

SUMMARY OF THE INVENTION

The present invention aims to provide a new integrated circuit placement method of an integrated circuit to obtain an optimal placement according to the mini-cut method.

A feature of the present invention resides in an integrated circuit placement method for designing according to a mini-cut method a layout of a plurality of cells forming an integrated circuit by setting a cut line which divides the integrated circuit into a plurality of blocks and moving the cells such that a number of cuts as a number of nets connecting the cells and traversing the cut line can be minimum, comprising first process P1 for detecting from the nets a stable net which has caused a local minimum state if the number of cuts has reached the local minimum state after executing the mini-cut method, second process P2 for selecting all or a part of detected stable nets and moving cells connected to the selected stable nets and laid out in different blocks to either of the blocks and third process P3 for detecting from the nets a stable net if it is determined that the number of cuts of the net cannot reach a sub-optimum state after executing the mini-cut method immediately following the second process P2, and for reactivating the second process P2.

BRIEF DESCRIPTION OF THE DRAWINGS

One skilled in the art can easily understand additional features and objects of this invention from the description of the preferred embodiments and some of the attached drawings. In the drawings:

FIG. 16 shows cut flags associated with FIG. 8;

FIG. 17 shows stable flags associated with FIG. 9;

FIG. 21 shows moved flags associated with FIG. 9;

FIG. 22 shows the stable net table associated with FIG. 9;

FIG. 34 shows cut flags associated with FIG. 29;

FIG. 35 shows stable flags associated with FIG. 29;

FIG. 38 shows moved flags associated with FIG. 29;

FIG. 39 shows the stable net table associated with FIG. 29;

PREFERRED EMBODIMENTS OF THE INVENTION

Figure 3:
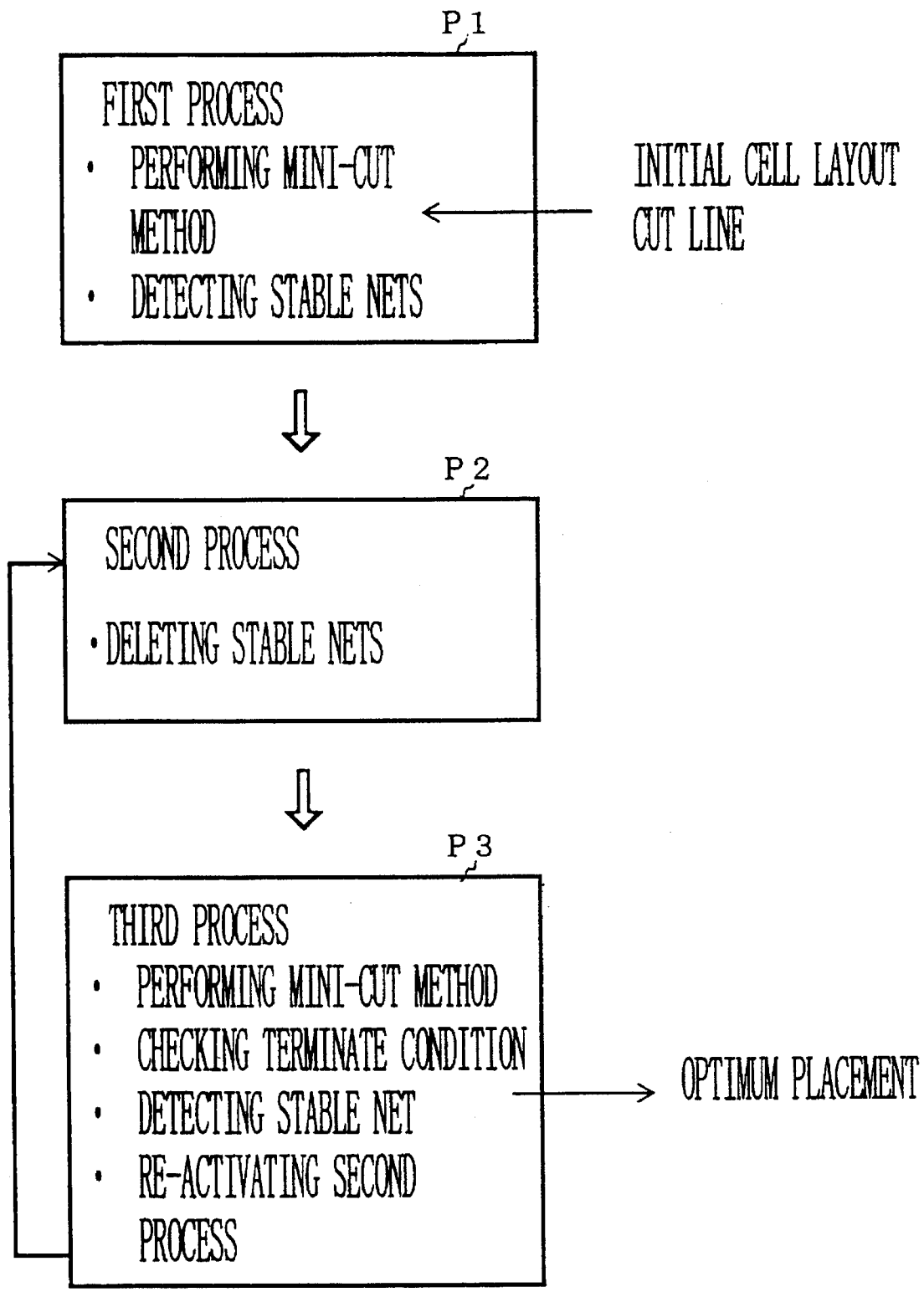
FIG. 3 shows the principle of the present invention.

FIG. 3 shows the configuration according to the principle of the present invention.

In FIG. 3, P1 is a first process; P2 is a second process; and P3 is a third process.

In the first process P1, if an initial cell placement and a cut line are assigned, the mini-cut method is performed on the initial cell placement. Then, if the cut size obtained by the mini-cut method has reached a local stable state (local minimum), then the mini-cut method is completed and nets which may cause the local minimum are detected as the stable nets.

In the second process P2, all or a part of stable nets is deleted (unstabilized) by selecting all or a part of the stable net detected in the first process P1 (the third process P3 if it is activated first) and by moving the cells connected to the selected stable nets and placed in different blocks to either of the blocks.

In the third process P3, the mini-cut method is resumed from the cell placement after the movement of the cells performed in the second process P2. If it is determined that the terminate conditions are satisfied, then the cell position (for the set cut line) is output as a result of the execution of the mini-cut method. On the other hand, the stable net is detected from the net, and the result is used as initial solution to reactivate the second process P2. According to the present invention, the terminate conditions are defined to be, for example, a state indicating a sufficiently reduced the cut size, that is, a state indicating the cut size smaller than a predetermined threshold.

According to the present invention, if an initial cell placement and a cut line are assigned, the first process P1 performs the mini-cut method based on the initial cell placement. If the cut size obtained by the mini-cut method has reached a local minimum state, the mini-cut method is completed and the stable nets causing the local minimum state are detected from the nets.

Figure 4:
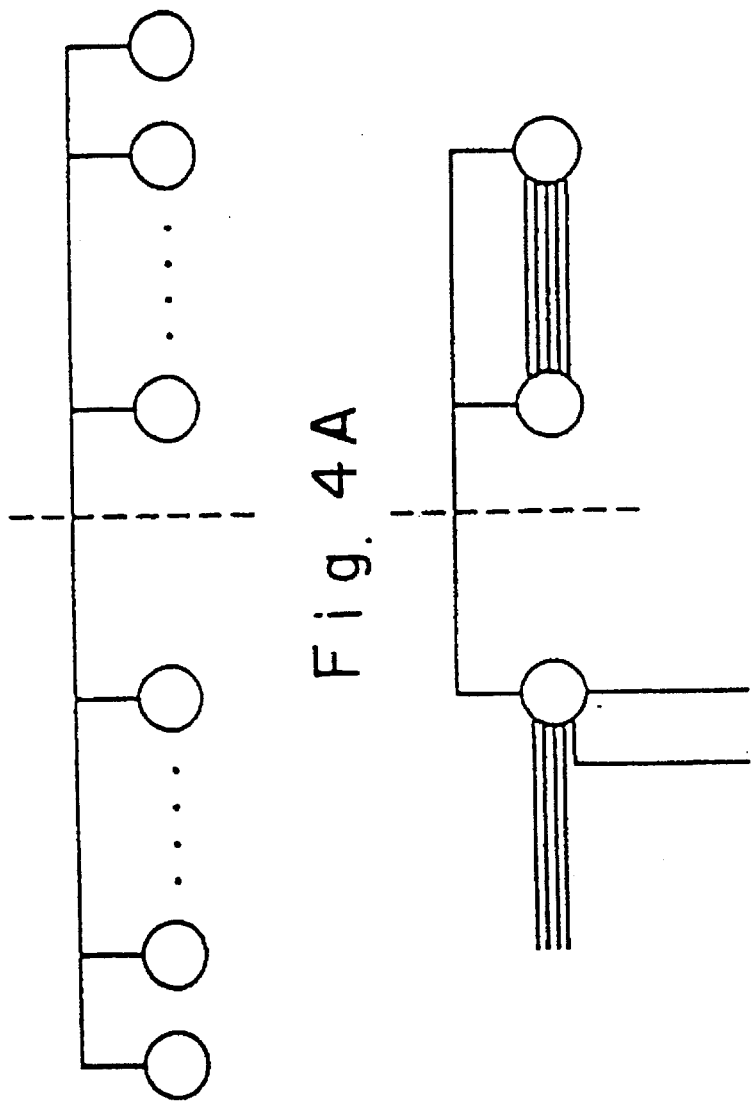
FIGS. 4A and 4B show stable net definitions.

For example, detected as a stable net is a net which is cut at the start of the mini-cut method and also cut at the end of the mini-cut method; a net which is cut at the end of the mini-cut method and has a number of cells connected to it as shown in FIG. 4A; and a net which is cut at the end of the mini-cut method and has a cell having many terminals connected to it as shown in FIG. 4B.

Thus, the defined stable net has the characteristic of reducing the cut size, thereby preventing a terminal condition from being satisfied.

Thus, if a mini-cut method of a multi-division level higher than a two-way mini-cut method is used, for example, a quadratic mini-cut method having two or more cut lines is used, then added is a net such as a long net having a long connection to improve the connection efficiency; a net traversing a complicated cut line to level the congestion among cut lines; a net having a long connection and traversing a complicated cut line to improve the connection efficiency and level the congestion. The "connection efficiency" indicates the number of connections realized of the necessary number of connections when cells are connected in a determined cell placement.

Thus, if the stable net is detected in the first process P1, then all or a part of the detected stable nets is selected to move the cells connected to the selected stable net and placed in different blocks to either of the blocks in the second process P2, thereby deleting (unstabilizing) all or a part of the stable nets.

If a mini-cut method of a multi-division level higher than a halving method is used, then a stable net is selected by prioritizing a stable net having a long connection to delete a stable net having a long connection by priority; by prioritizing a stable net traversing a more complicated cut line to delete a stable net traversing a complicated cut line by priority; and by prioritizing a stable net having a long connection and traversing a complicated cut line to delete a stable net having a long connection and traversing a complicated cut line by priority.

Then, cells are moved by placing a restriction that moved cells are prohibited from being moved again to protect against double moving and with consideration of balancing the area of each block with a total of cell areas involved.

Thus, if stable nets are deleted in the second process P2, then the mini-cut method is resumed in the third process P3 based on the cell placement after the movement of the cells in the second process P2. If it is determined that the terminal conditions have been satisfied, then the cell placement (for the set cut line) is output as a result of the execution of the mini-cut method. On the other hand, the stable nets are detected from the net, and the detected nets are used as information to reactivate the second process P2.

As described above, the mini-cut method is performed in the present invention. If a local minimum state has been reached, stable nets which have caused the local minimum is detected. After the stable nets are deleted, the mini-cut method is resumed and this process is repeatedly performed. Thus, the stable states can be reached with a much smaller cut size than conventional methods.

Thus, stable nets with a longer connection or a stable net traversing a more complicated cut line are deleted by priority. Otherwise, stable net is deleted after cells are moved such that the area of each block is balanced with a total of the cell areas involved. Thus, cells can be placed with a short connection, level and minimum congestion, and a well-balanced area.

As mentioned above, the present invention provides a method of designing the optimum placement of cells in an integrated circuit according to the mini-cut method.

Figure 5:
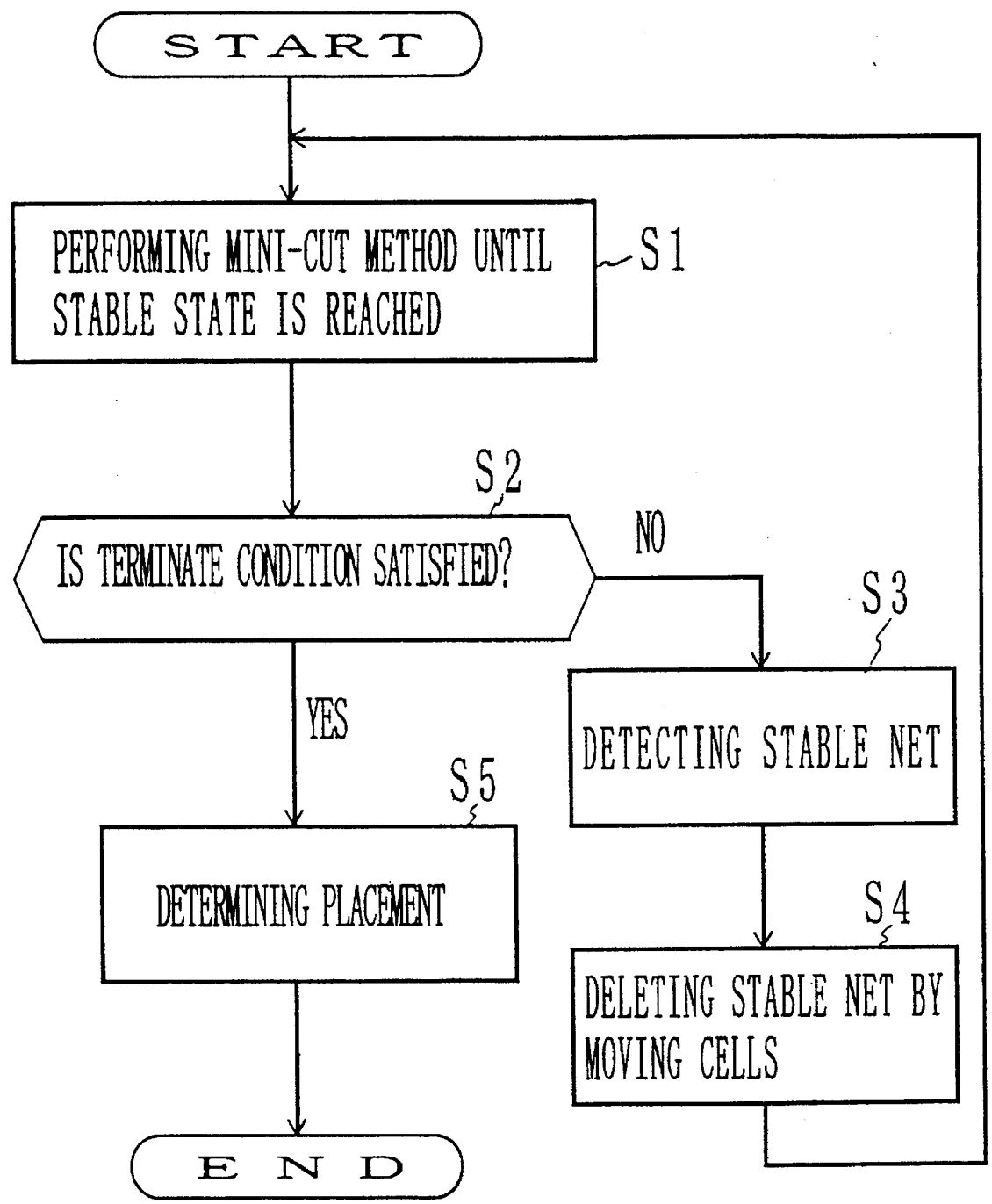
FIG. 5 is a flowchart of the entire process of the placement method of the present invention.

FIG. 5 is the flowchart of the entire process of the cell placement method according to the present invention. In FIG. 5, cut lines are set to divide an integrated circuit into a plurality of blocks, and a mini-cut method is performed in which cells are moved such that the number of nets connecting the cells which traverse the cut line, that is, the cut size, can be minimum.

In FIG. 5, when the process is started, the mini-cut method is performed until the number of the connections of cells traversing the cut line, that is, the number of the cuts in the net, reaches a stable state in step S1, and it is determined in step S2 whether the terminate condition is satisfied. The determination is based on, for example, whether or not the cut size equal to or smaller than a predetermined threshold.

If the determination indicates a local stability in step S2, then the connection of cells which causes the local stable state among the connections of cells traversing the cut line is detected as a stable net in step S3.

Then, in step S4, the processes on and after step S1 are repeatedly performed after the stable net deleting process are performed by moving to another block, in all or a part of the detected stable nets, all cells in a block which is connected to a stable net, and by changing the stable net such that the stable net does not traverse the cut line. If it is determined that the terminate condition is satisfied in step S2, then it is determined in step S5 that the result of the mini-cut method has obtained the optimum placement of the cells in the integrated circuit, and then the process terminates.

Figure 6:
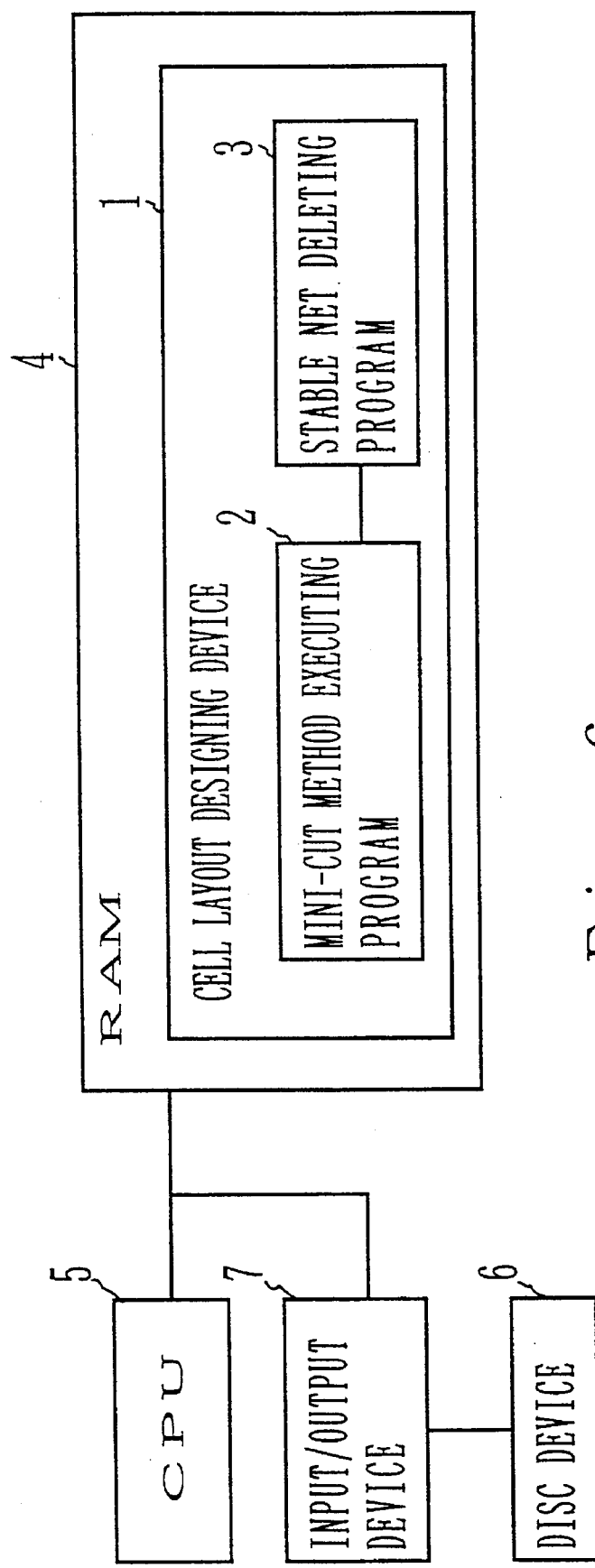
FIG. 6 is a block diagram showing the computer system operated by the placement method of the present invention.

FIG. 6 is the block diagram showing the configuration of the entire computer system for performing the cell placement method according to the present invention. In FIG. 6, an integrated circuit cell placement device 1 according to the present invention comprises a mini-cut method executing program 2 and stable nets deleting program 3, and is stored in a part of an area of a random access memory (RAM) 4. The placement method according to the present invention is executed by a central processing unit (CPU) 5 using the program in the RAM 4. When the method is executed, placement data stored in a disk device 6 are input to the CPU 5 through an input/output device 7.

Figure 7:
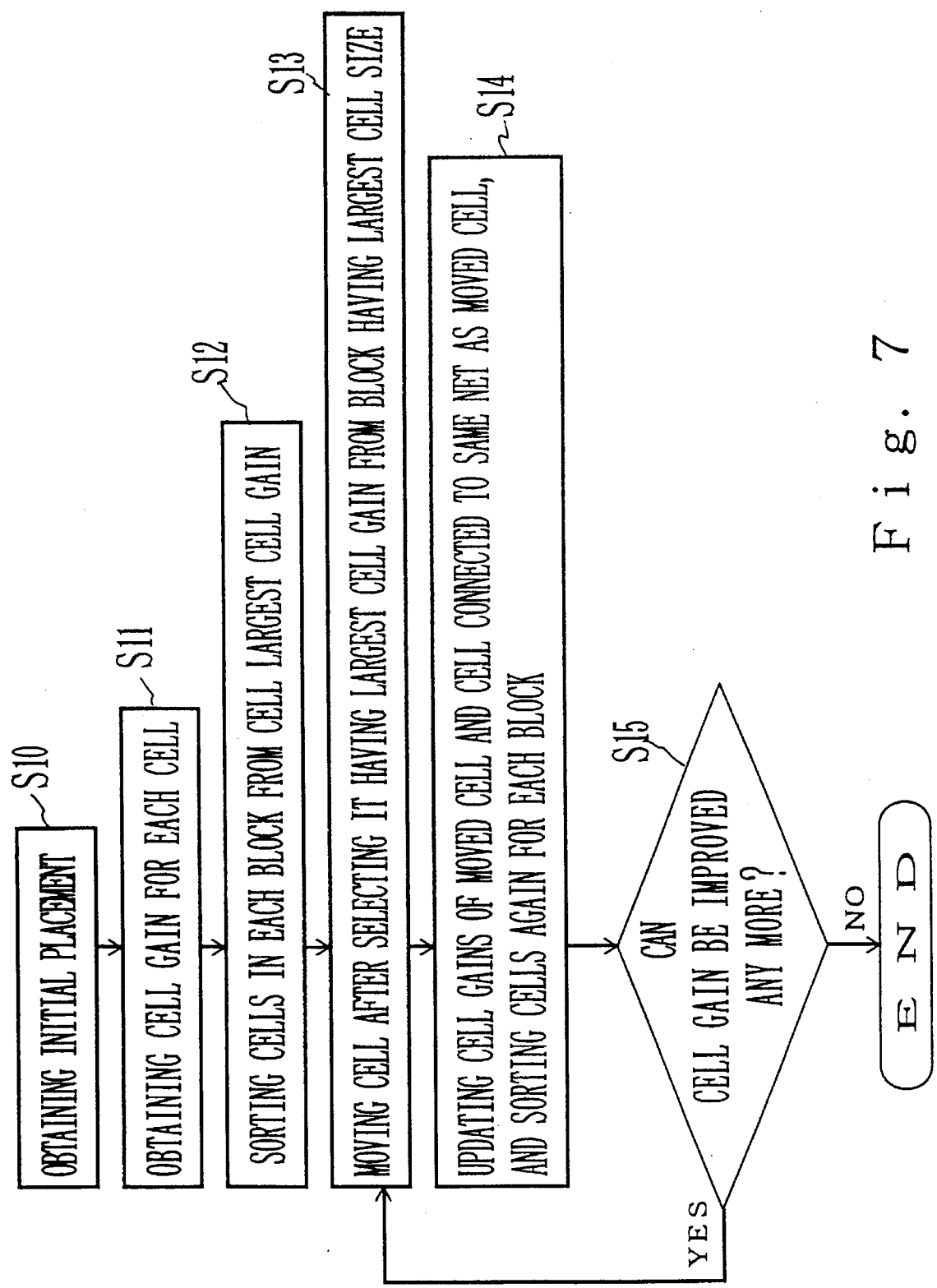
FIG. 7 is a flowchart showing the processes of the mini-cut method.

FIG. 7 is the flowchart of the process performed by the mini-cut method executing program 2 in the mini-cut method as shown in FIG. 6. In FIG. 7, an initial placement is obtained in step S10, and a cell-gain is obtained for each cell based on the initial placement in step S11, and cells of each block are sorted by the cell-gain size from largest to smallest in step S12.

Then, in step S13, the cell having the largest cell-gain is selected from the block having the largest cell area, that is, the largest total of cell areas, and the cell is moved to another block. In step S14, the cell-gains of the moved cell and the cells connected to the moved cell through the net are updated. Then, the cells are sorted again by the cell-gain size from largest to smallest in each block.

In step S15, it is determined whether or not a stable state has been reached, that is, whether or not the cell-gain cannot be improved any more, namely, whether or not the cut size can be reduced. If the cell-gain can be improved, the processes on and after step S13 are repeatedly performed and the entire process terminates if it is determined that the cell-gain cannot be improved any more and the stable state has been reached.

Figure 1:
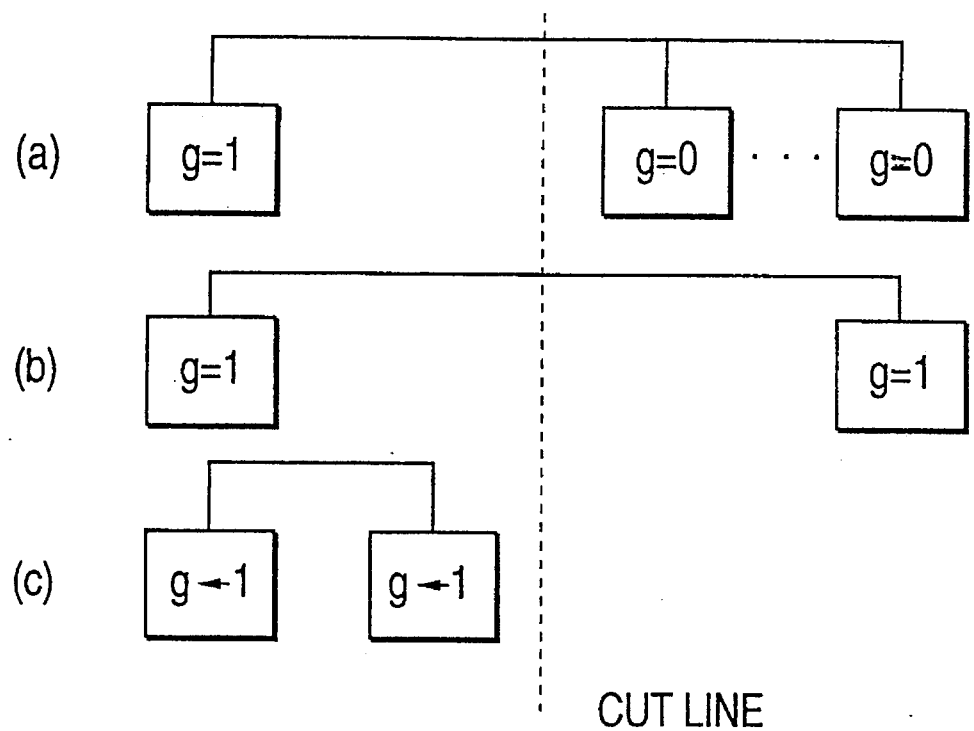
FIG. 1 shows the definition of a cell-gain.
Figure 2:
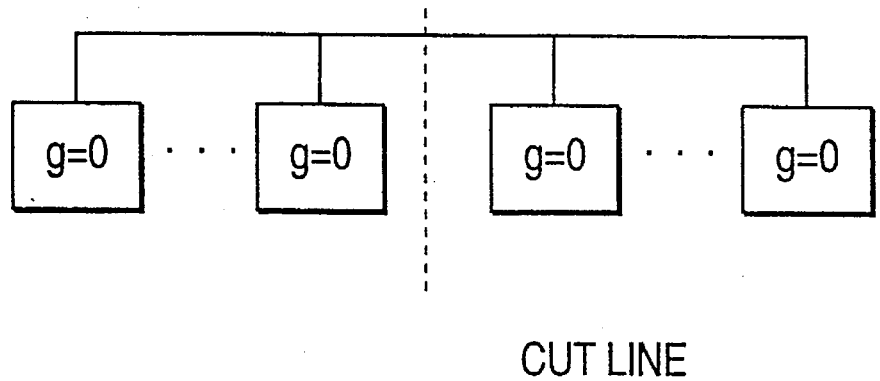
FIG. 2 shows the state in which a plurality of cells are positioned on either side of a cut line.

As described above, in the placement method according to the present invention, the mini-cut method is executed and a detected stable net is deleted, and then the mini-cut method is executed again. These processes are repeatedly performed. First, the two-way mini-cut method in which a single cut line is used as shown in FIGS. 1 and 2 is described in detail below.

Figure 8:
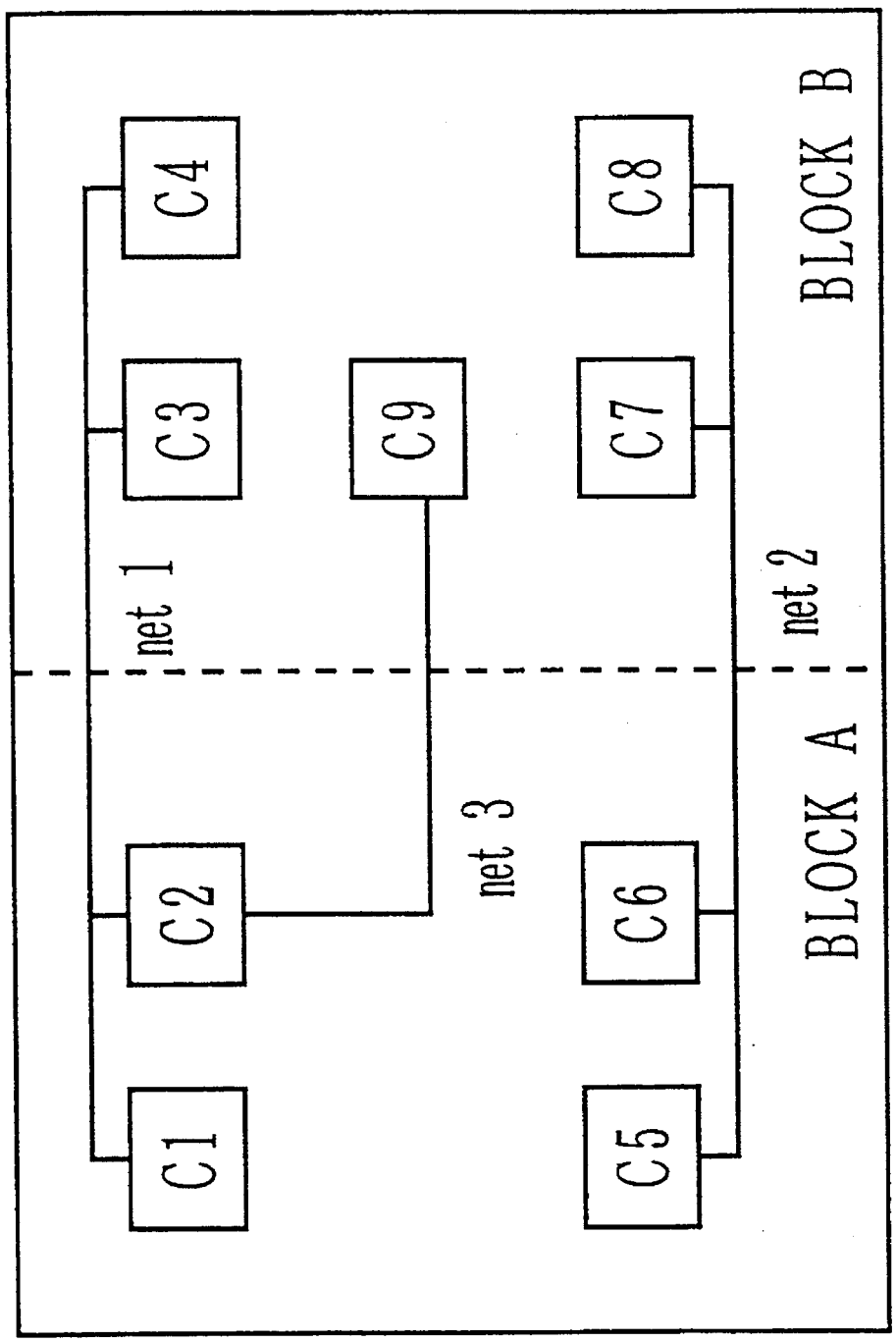
FIG. 8 shows an example of an initial placement of cells.
Figure 9:
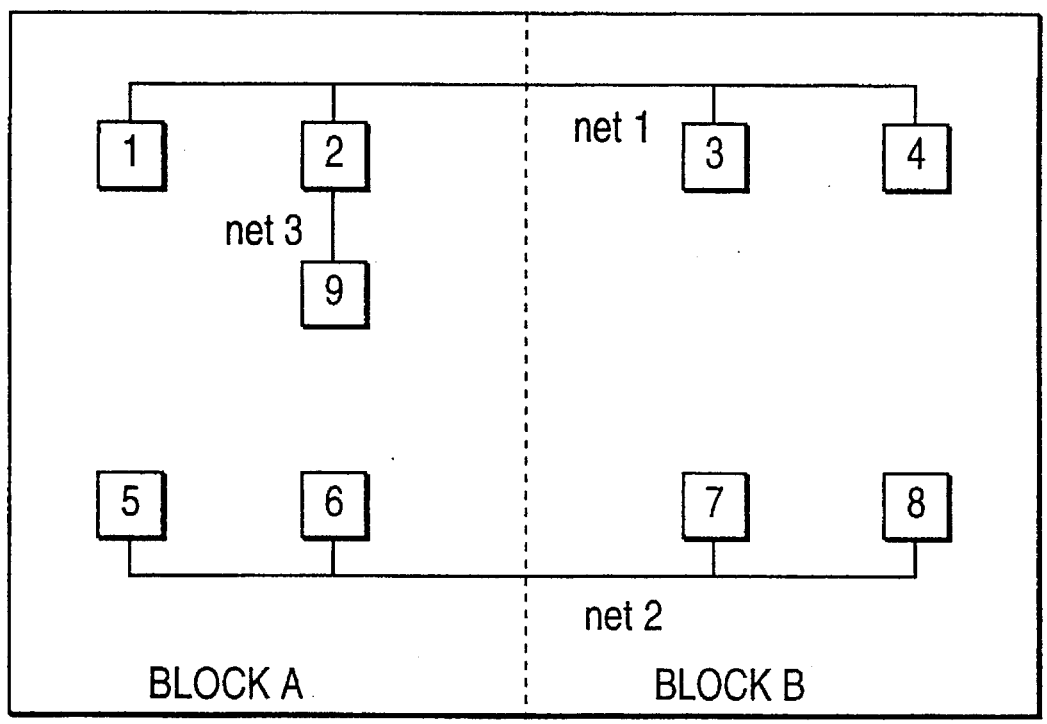
FIG. 9 shows an execution result of the mini-cut method performed as shown in FIG. 8.

FIG. 8 shows an example of the initial placement of cells according to the two-way mini-cut method. In this example, the mini-cut method is performed by the mini-cut method executing program 2 shown in FIG. 6, and the execution result of the mini-cut method is provided for the stable net deleting program 3 when the cut size has got in a stable state. It is shown in FIG. 9. As compared with the initial placement shown in FIG. 8, net 3 is changed into a non-cut configuration.

Figure 10:
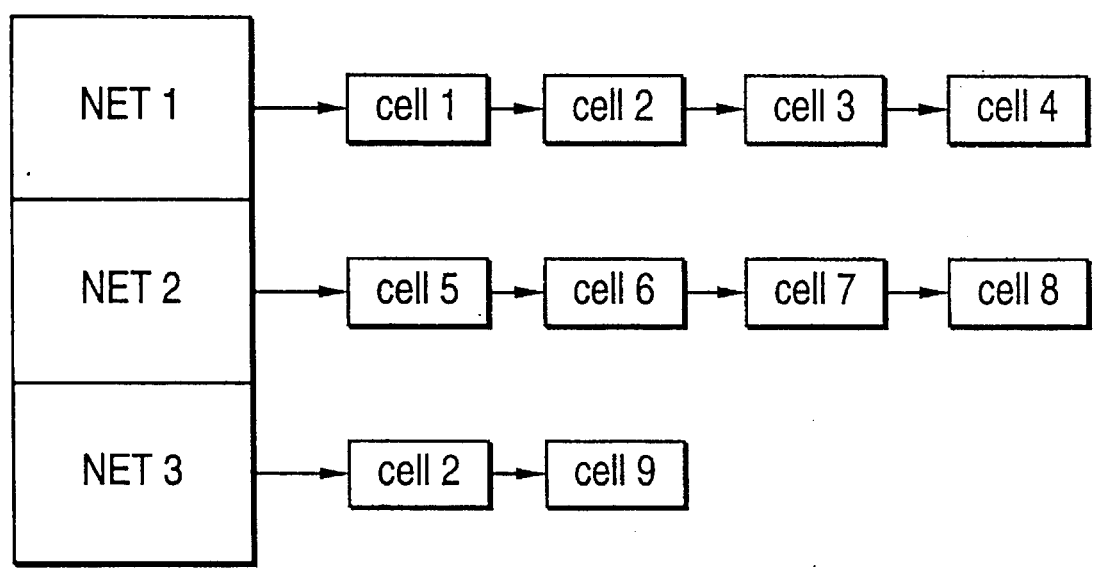
FIG. 10 is a cell list corresponding to the result shown in FIG. 9.
Figures 11, 12:
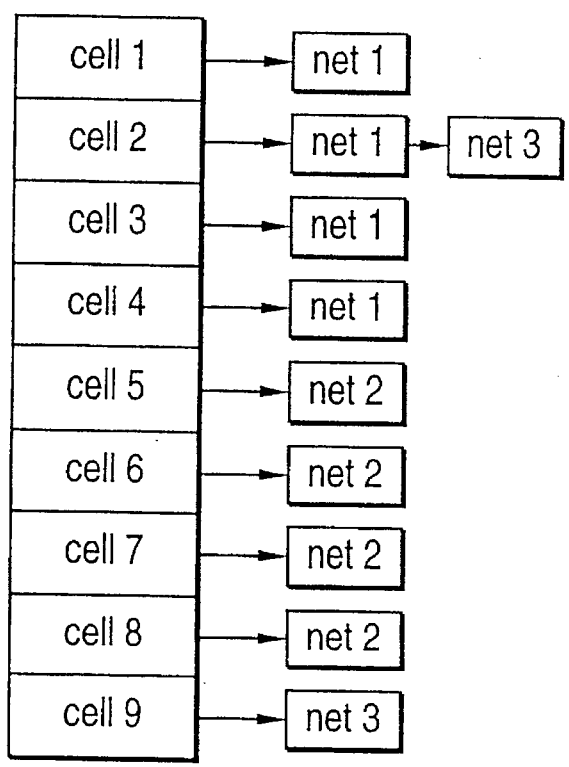
FIG. 11 is a net list corresponding to the result shown in FIG. 9.
FIG. 12 shows a cell display information corresponding to the result shown in FIG. 9.

The execution result of the mini-cut method provided by the mini-cut method executing program 2 to the stable net deleting program 3 is a net-to-cell and cell-to-net information and is represented as a cell list shown in FIG. 10, a net-list shown in FIG. 11, and cell placement information shown in FIG. 12.

The cell-list shown in FIG. 10 shows the connection of each net to cells. The net list shown in FIG. 11 lists the connections of cells to a net. The cell placement information shown in FIG. 12 indicates the position of each cell in a block. For example, cell 2 is connected to nets 1 and 3. An arrow from cell 2 to net 1 and an arrow from net 1 to net 3 in the net list shown in FIG. 11 indicate data structures.

Thus, if the cell/net information is received from the mini-cut method executing program 2, then the stable net deleting program 3 first detects the stable nets causing the local minimum state from the received nets, and stores the detection result in variable stable flags.

Figure 13:
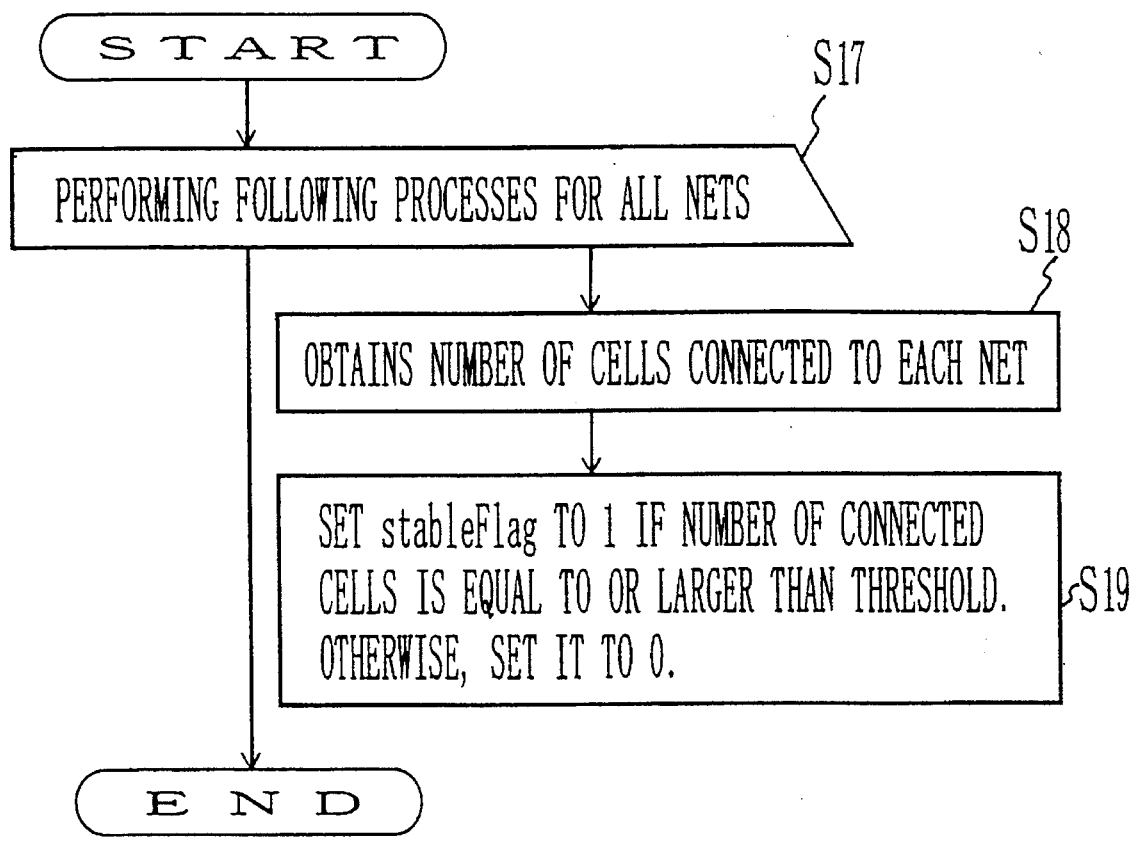
FIG. 13 is a flowchart (1) of the processes of detecting a stable net according to the stable net deleting program.
Figure 14:
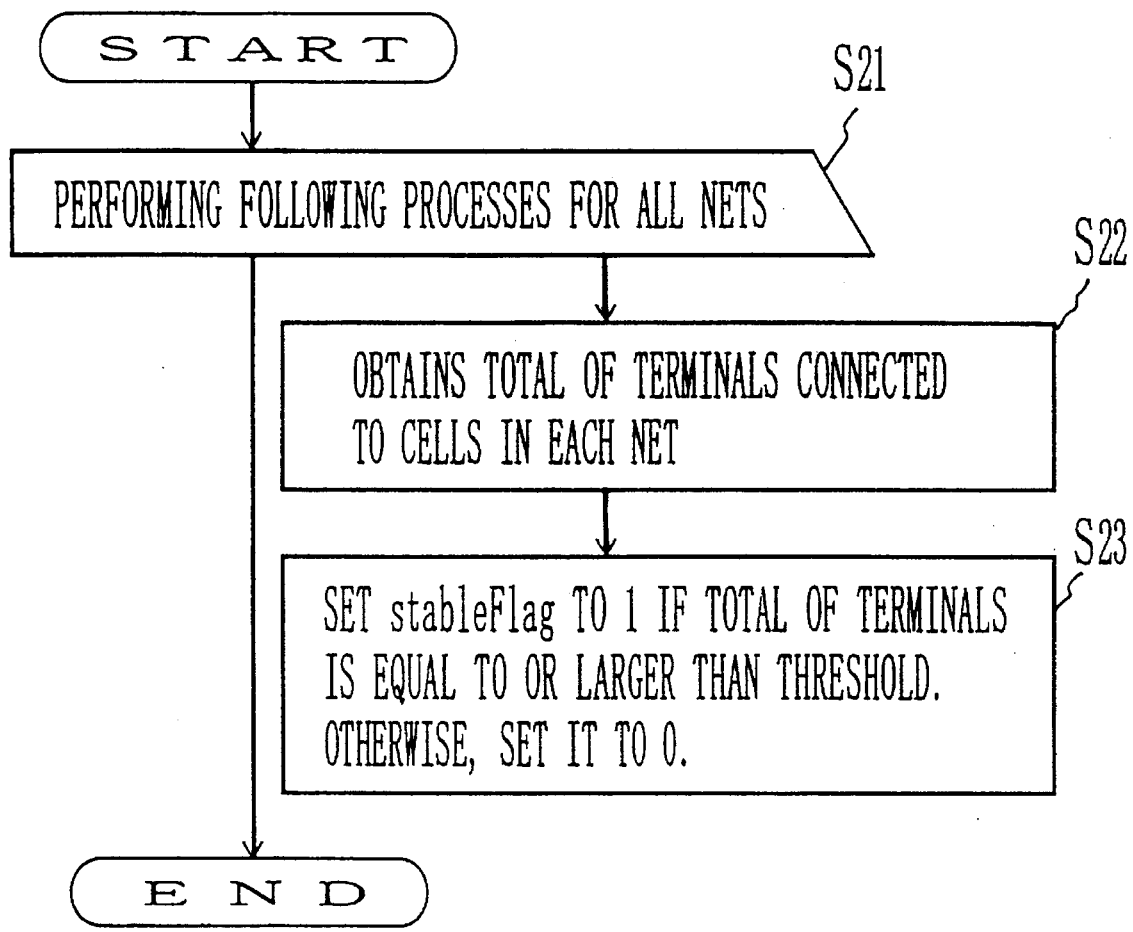
FIG. 14 is a flowchart (2) of the processes of detecting a stable net according to the stable net deleting program.
Figure 15:
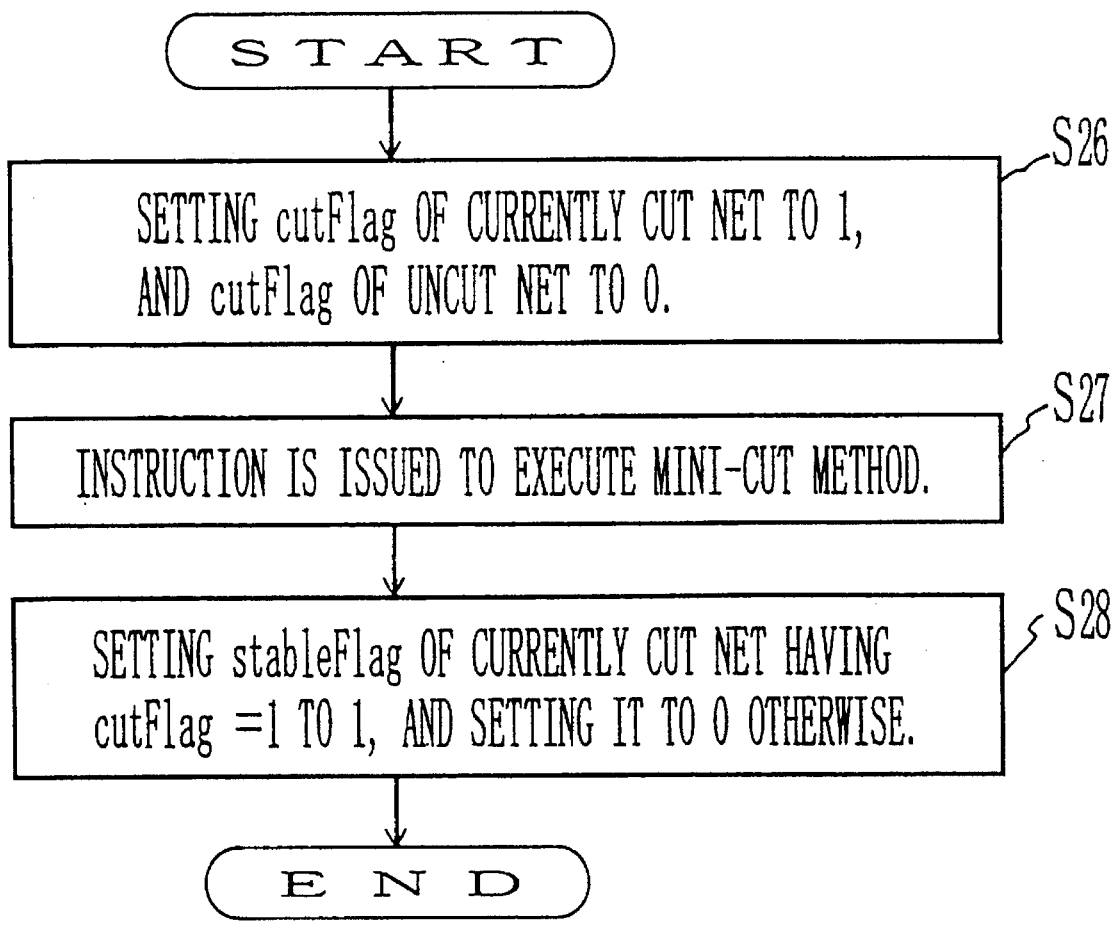
FIG. 15 is a flowchart (3) of the processes of detecting a stable net according to the stable net deleting program.

FIGS. 13, 14, and 15 show the embodiments of the processes of detecting stable nets executed by the stable net deleting program 3.

According to the process flow shown in FIG. 13, the stable net deleting program 3 obtains the number of cells connected to each net in step S18. If the number of connected cells is larger than a predetermined threshold, for example, three or more, then the net is determined to be a stable net. If it is smaller than the threshold, the net is not determined to be a stable net, and the detection result is stored in a variable stable flag in step S19. As described later, a normal stable net should be cut and therefore the stable net detected here should be referred to as a temporary stable net.

In FIG. 13, if there is still a remaining net in step S17, the processes in steps S18 and S19 are performed repeatedly, and the entire process terminates when it is determined in step S17 that the processes have been performed for all nets. The following flowcharts can be interpreted similarly.

According to the flowchart shown in FIG. 14, the stable net deleting program 3 obtains in step S22 the number of terminals connected to the cells which are connected to each net. If the number is equal to or larger than a predetermined threshold, then the net is determined to be a stable net. If it is smaller than the predetermined threshold, then it is determined that the net is not a stable net, then the detection result is stored in the variable stable flag in step S23. As described later, a normal stable net should be and therefore the stable net detected here should be referred to as a temporary stable net.

On the other hand, according to the flowchart shown in FIG. 15, the stable net deleting program 3 first detects a net cut at the initial placement shown in FIG. 8 at the start of the process of the mini-cut method executing program 2, stores the detection result in the variable cut flag as shown in FIG. 16 in step S26, activates the mini-cut method executing program 2, determines that a net is a stable net if it is cut and stored in the variable cut flag at the end of the process of the mini-cut method executing program 2 and otherwise determines that the net is not a stable net in step S27. In step S28, it stores the detection result in the variable stable flag.

Thus, the stable net deleting program 3 detects that, for example, nets 1 and 2 are stable nets and net 3 is a non-stable net when the execution result of the mini-cut method shown in FIG. 9 is received after executing the processes shown in FIGS. 13, 14, and 15, and stores the detection result in the variable stable flag as shown in FIG. 17.

After storing the detection result of the stable net in the variable stable flag, the stable net deleting program 3 performs a process of changing the detected stable net into an unstable net.

Figure 18:
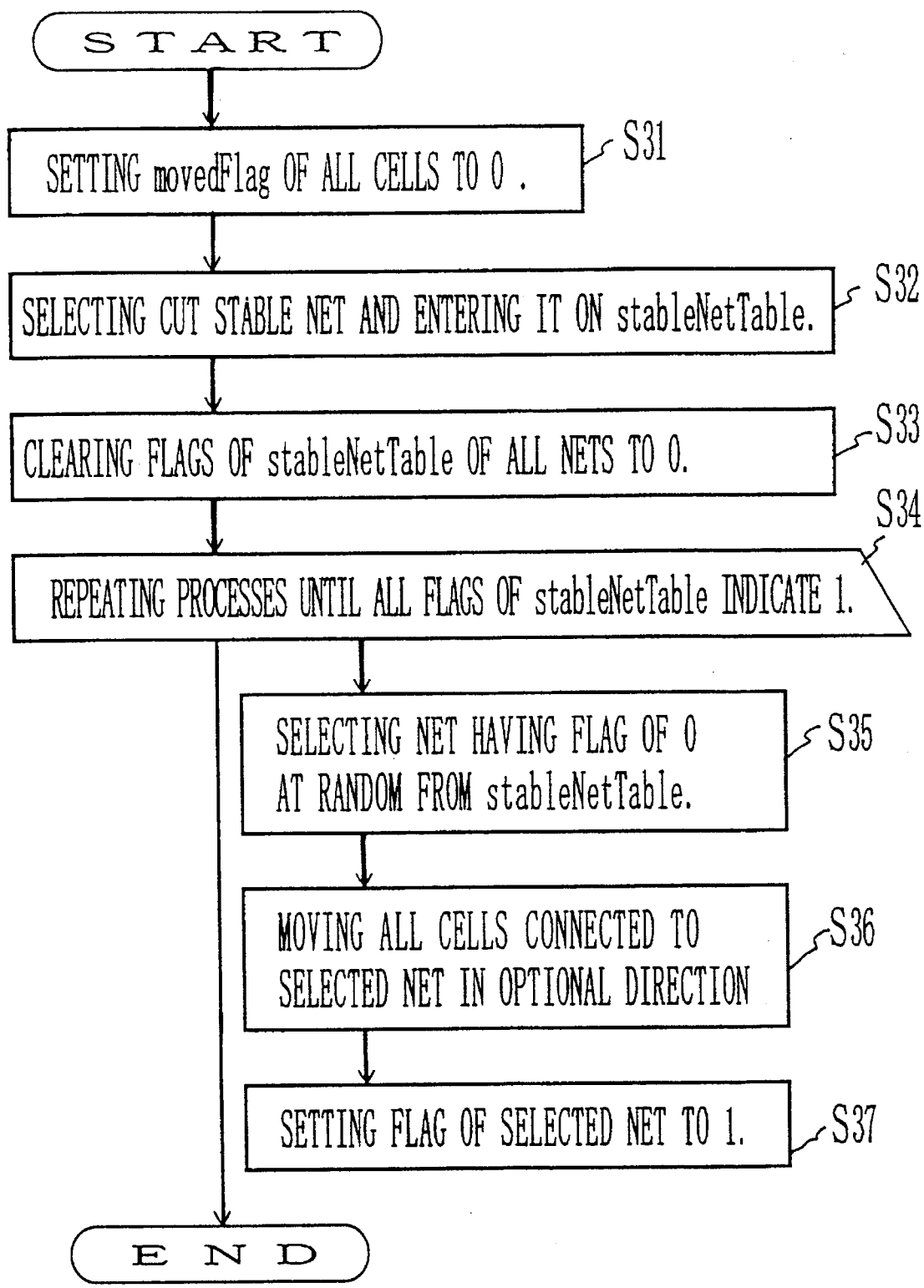
FIG. 18 is a flowchart of the processes of deleting a stable net according to the stable net deleting program.
Figure 19:
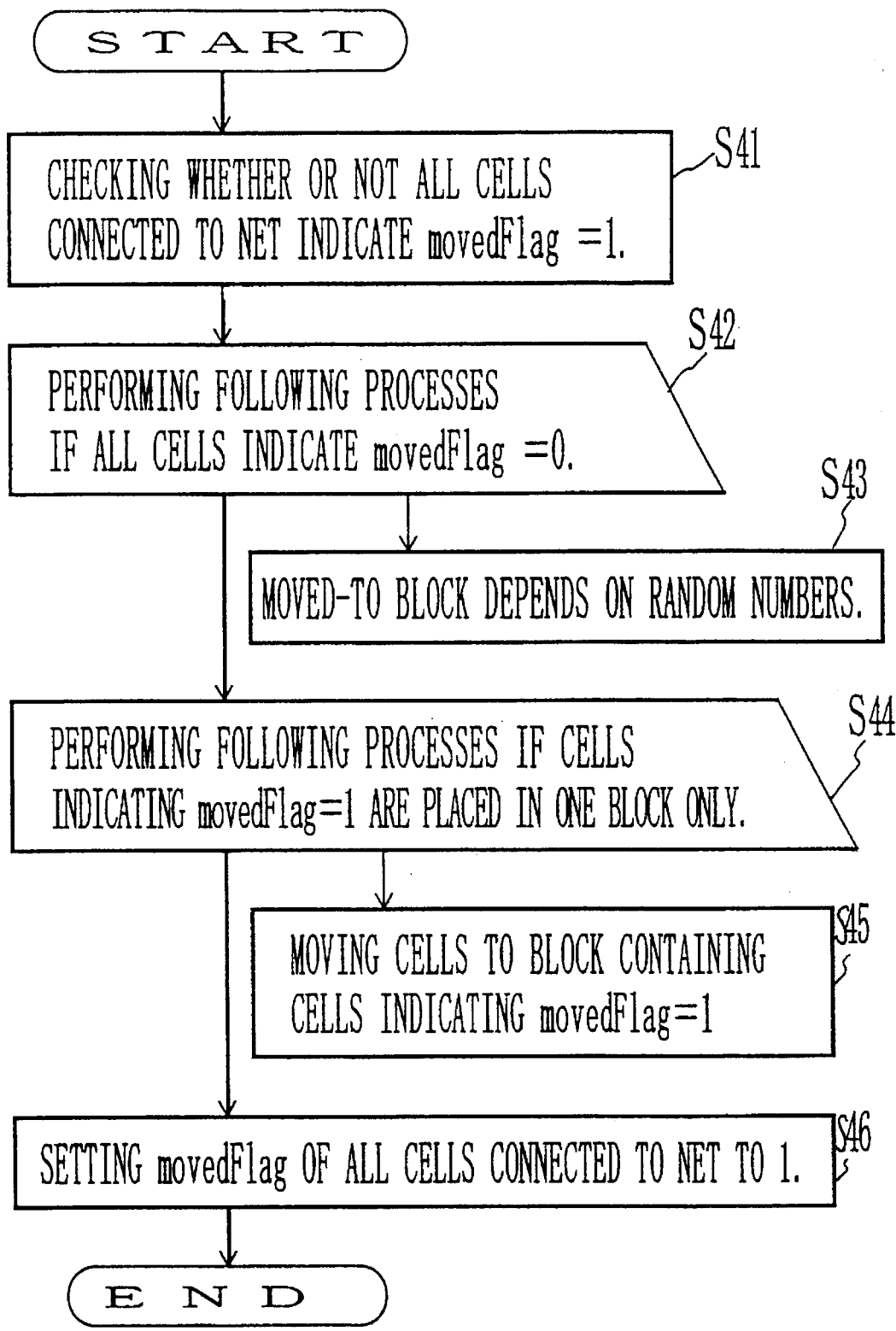
FIG. 19 is a flowchart (1) of the processes of moving cells according to the stable net deleting program.
Figure 20:
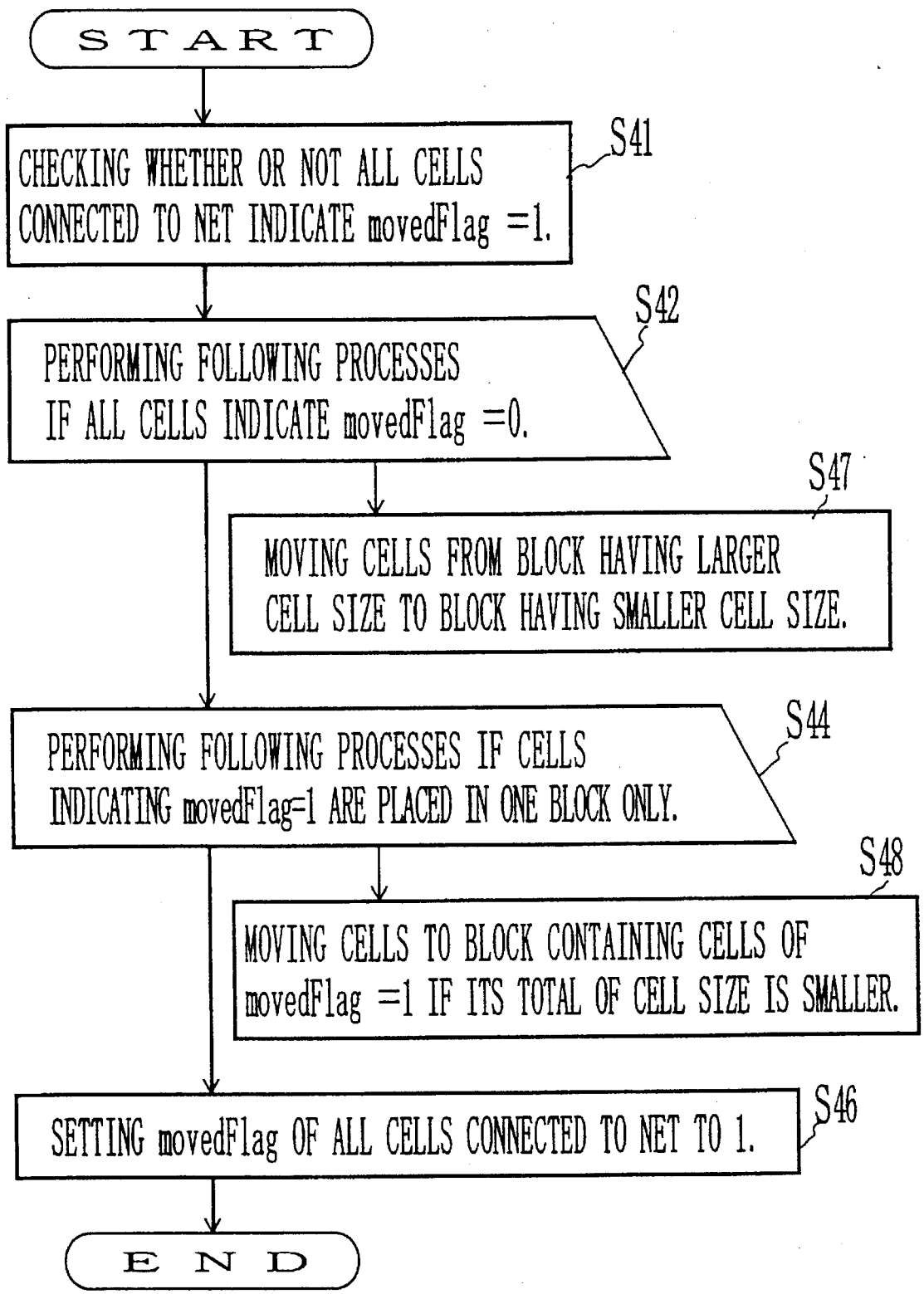
FIG. 20 is a flowchart (2) of the processes of moving cells according to the stable net deleting program.

FIGS. 18, 19, and 20 show embodiments of processes of deleting a stable net performed by the stable net deleting program 3. Described below is the stable net deleting process performed by the stable net deleting program 3 according to the processes shown in FIGS. 18, 19 and 20.

If a stable net has been detected, the stable net deleting program 3 first sets all entries of the variable moved flag (provided corresponding to a cell) to a flag value of 0 in step S31 as shown in the process flowchart shown in FIG. 18. Each entry of the variable moved flag indicates whether or not the cell has been moved. In step S31, a flag value of 0 is set to indicate that all cells have not been moved yet as shown in FIG. 21.

Then, in step S32, selected as a stable net to be processed is a net whose variable stable flag indicates a stable net and which is actually cut. The net name of the selected stable net is entered on the variable stable net table. In step S33, all entries on the variable stable net table are set to the flag value of 0. Each entry of the variable stable net table indicates whether or not the process for the stable net has been completed. In steps S32 and S33, a net name of a stable net is entered on the variable stable net table, and all entries are set to the flag value of 0 to indicate that no stable nets have been processed as shown in FIG. 22.

Then, in step S34, the processes in steps S35 through 37 are repeatedly performed until the flag values of all entries in the variable stable net table indicate 1.

That is, in step S35, a stable net indicating the flag value of 0 is selected at random from among the stable nets entered on the variable stable net table. In step S36, cells are moved such that all cells connected to the selected stable net are put together in one block. In step S 37, the flag value of the selected stable net is set to 1. These processes are repeatedly performed until all entries indicate 1 on the variable stable net table.

The processes shown in FIGS. 19 and 20 show in detail the cell moving process shown in FIG. 18 and performed in step S36. The flow of the processes are described below.

If a request has been issued to move a cell in a stable net, then it is determined whether or not the variable moved flag is set to 1 for all cells connected to the stable net which has issued a cell movement request in step S41 as shown in the flowchart shown in FIG. 19. That is, it is determined whether or not all cells connected to the stable net issuing a cell movement request have been moved.

Next, in step S42, it is determined whether or not the flags of all cells are set to 0 according to the checking process in step S41. If it is determined that the flags of all cells are set to 0, that is, if it is determined that the cells have never been moved, go to S43, and a moved-to block is selected according to random numbers to move a cell not located in the moved-to block among the cells connected to the stable net which has issued a cell movement request.

In step S42, if it is determined that the flags of all the cells do not indicate 0 according to the process in step S41, go to step S44 and it is determined whether or not the cells having the flag value of 1 are placed in one block only. If yes, go to step S45, and the cells connected to the stable net issuing a cell movement request are moved to the block in which a cell indicating the flag value of 1 is located. That is, a cell which has ever been moved is prohibited from being moved again. Thus, cells are moved to a specified block.

If it is determined in step S44 that the process in step S45 has been completed or that the cells indicating the flag value of 1 are not placed in one block only, then go to step S46 and the variable moved flags of all cells connected to the stable net issuing a cell movement request are set to 1, and then the process terminates. Even if a cell is not moved, the moved flag is set to 1 to protect an unnecessary process from being indefinitely performed because it is possible that the cell is not moved again after the next execution of the mini-cut method.

Thus, according to the process shown in FIG. 19, cells are moved such that all cells connected to a stable net which has issued a cell movement request are put in one block. In the process, the cells are moved without consideration of balancing a block area with a total of cell areas involved in the block.

In the process shown in FIG. 20, assuming that two block areas are equal, a block having a smaller total of cell areas is selected as a moved-to block without selecting the moved-to block according to random numbers in step S47 corresponding to step S43 shown in FIG. 19. In step S48 corresponding to step S45 shown in FIG. 19, cells are moved such that a block having a smaller total of cell areas is selected as a moved-to block without unconditionally moving to a block having cells indicating the flag values of 1.

Figure 23:
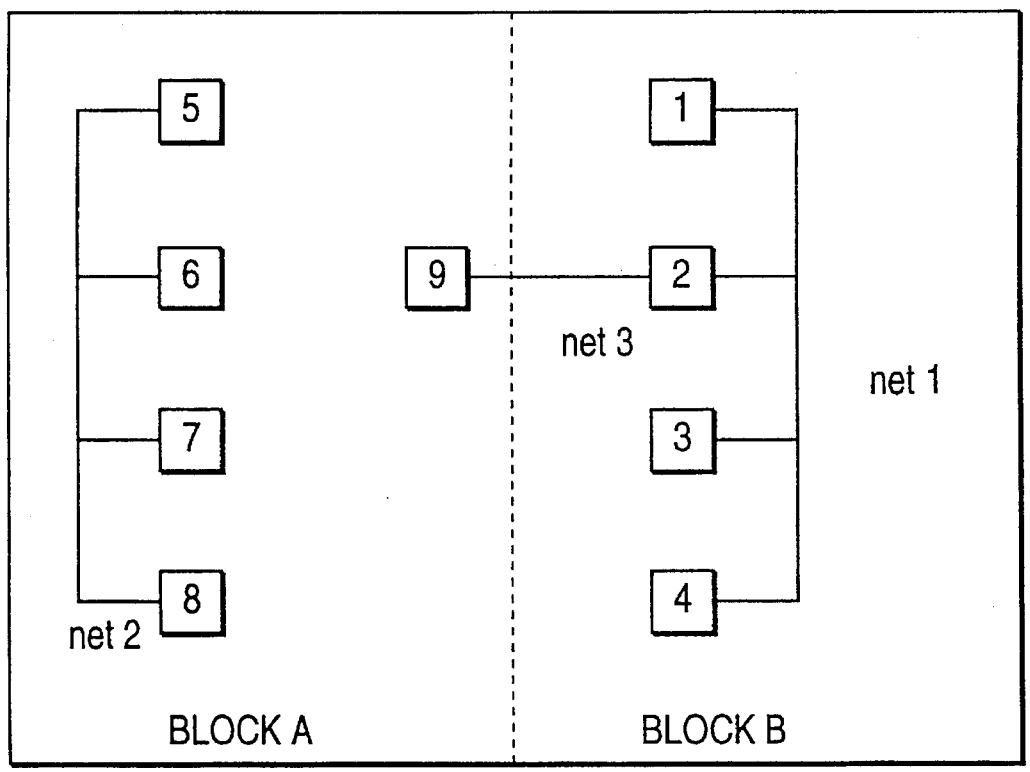
FIG. 23 shows a result of deleting a stable net.
Figure 24:
FIG. 24 shows a result of developing cell placement information.

Thus, upon receipt of an execution result of the mini-cut method from the mini-cut method executing program 2 as shown in FIG. 9, the stable net deleting program 3 selects from it and puts, for example, stable net 1 in block B and stable net 2 in block A so as to develop the received net-to-cell and cell-to-net a placement as shown in FIG. 23. That is, the cell placement information received from the mini-cut method executing program 2 and shown in FIG. 12 is developed into the placement shown in FIG. 24.

Upon completion of the development of the cell placement information, the stable net deleting program 3 instructs the mini-cut method executing program 2 to resume the mini-cut method using updated cell placement information as new cell placement information.

Upon receipt of the resume instruction from the stable net deleting program 3, the mini-cut method executing program 2 starts executing the mini-cut method again. If it determines a terminate condition, it outputs the cell placement as the execution result of the mini-cut method. On the other hand, it activates the stable net deleting program 3 again.

Thus, if the two-way mini-cut method is performed and outputs the cut size as a local minimum state, then the integrated circuit cell placement device 1 detects stable nets which have caused the local minimum state, deletes the stable nets, and executes the mini-cut method again. The optimum cell placement can be obtained for a given cut line after repeating the above described processes.

The integrated circuit placement method of the present invention has been described in detail above for one cut line, that is, for the case where the two-way mini-cut method is executed. Described below is the case where the number of cut lines are increased, that is, where the quadratic mini-cut method is performed and specifically relating to the quadratic mini-cut method.

As described later, as compared with the two-way mini-cut method, the quadratic mini-cut method has an advantage of the cut size exactly corresponding to the connection length. However, it also has the disadvantage of selecting a connecting method upon determination of a cell placement. Accordingly, a larger number of divisions are not always desirable, but practically the quadratic method is regarded as optimum.

Figure 25:
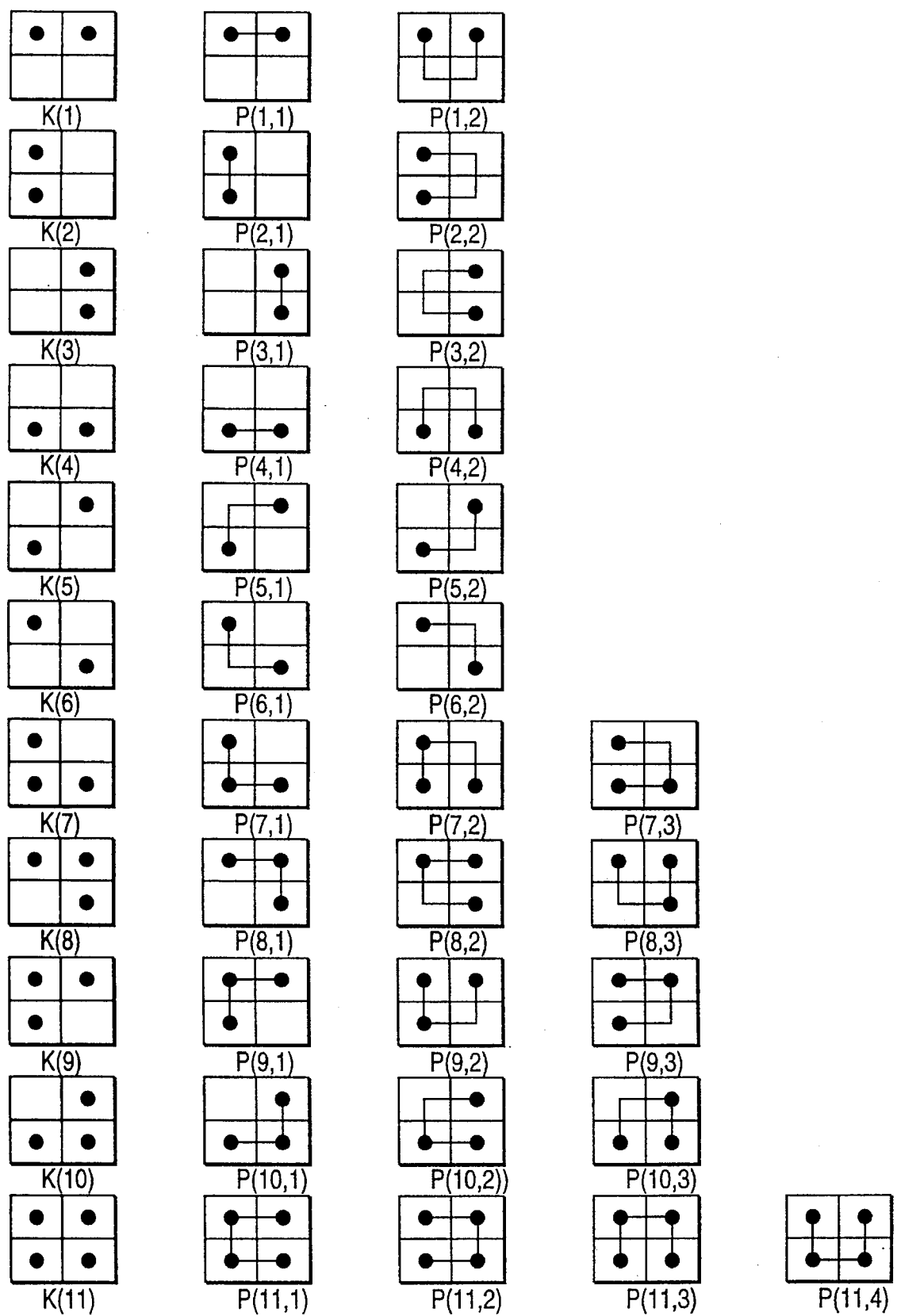
FIG. 25 shows the quartering mini-cut method (1)

FIG. 25 shows the definition of the position of cells and the number of cuts in the quadratic mini-cut method. In FIG. 25, a black dot is a block existing even if it contains only a single cell. A solid line connecting the black dots indicates a quadratic method in which blocks are cut into four divisions. The cut size directly indicates the length of the connection. K(i) indicates a cell pattern in which cells are located in each block of the four divisions. P(i,j) indicates possible connection pattern for K(i). The determination of the pattern is made by normally selecting the shortest connection. However, if, for example, a detour route should be selected, then an applicable pattern can be selected.

When the quadratic mini-cut method is performed, a cell-gain can be defined by the cut size decreased when a cell is moved from its block to other three blocks.

As compared with the two-way mini-cut method, the quadratic mini-cut method has the following advantages.

Figure 26A:
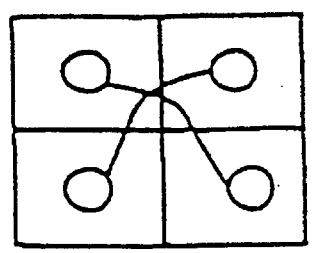
FIGS. 26A through 26D show the quartering mini-cut method (2)
Figure 26B:
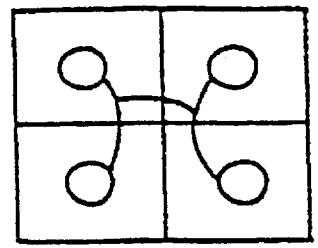
Figure 26C:
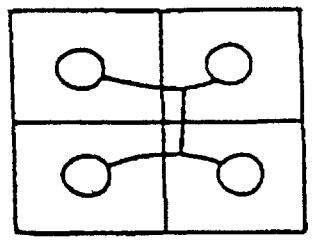
Figure 26D:
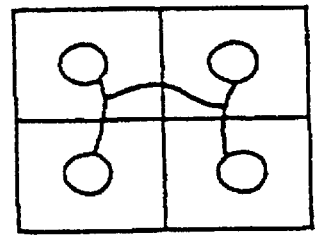

First, the cut size output by the quadratic mini-cut method directly reflects the connection length by counting the cut size in two dimensions. For example, assume that the cells in the network are placed in the four blocks as shown in FIG. 26A. According to the two-way mini-cut method, the cut size is one in both a vertical division and a horizontal division as shown in FIGS. 26B and 26C. On the other hand, according to the quadratic mini-cut method, the cut size is three and exactly indicates the connection length as shown in FIG. 26D. For example, according to a timing-driven placement, the quadratic mini-cut method is very effective because the placement requires estimating a precise length of the connection.

Figure 27A:
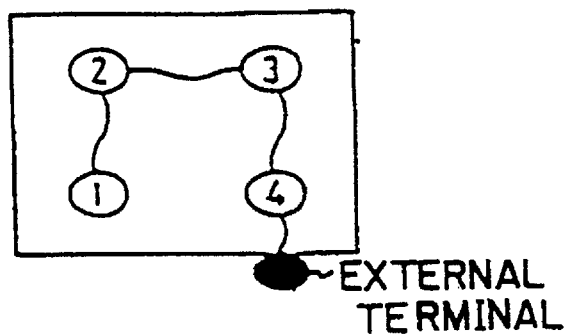
FIGS. 27A through 27E show the quartering mini-cut method (3)
Figure 27B:
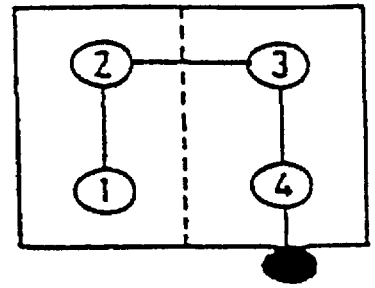
Figure 27C:
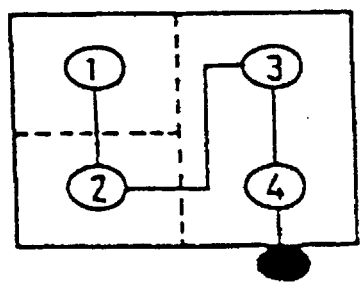

Second, the quadratic mini-cut method has the advantage of reducing the restrictions from a cut sequence. For example, in FIG. 27A the two-way mini-cut method first divides it vertically as shown in FIG. 27B, and then divides the left block horizontally as shown in FIG. 27C. At this time, since the cell 3 is regarded to be located at the center of the right block, the cut size is the same regardless of the upper/lower positions of cells 1 and 2.

Figure 27D:
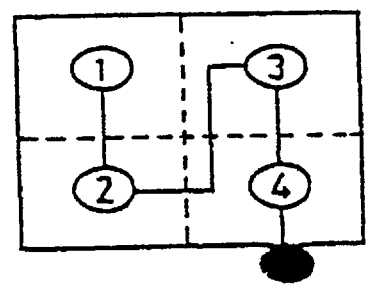
Figure 27E:
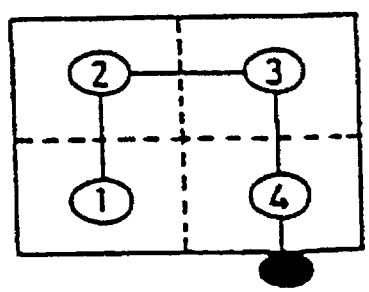

Then, the right block is divided horizontally as shown in FIG. 27D. At this time, since the cut size is the same regardless of the upper/lower positions of cells 3 and 4, cell 3 can be located upper. In this case, the cut size of the result is 1 larger than that of expected in FIG. 27E. On the other hand, the quadratic mini-cut method avoids such a disadvantage.

Figure 28:
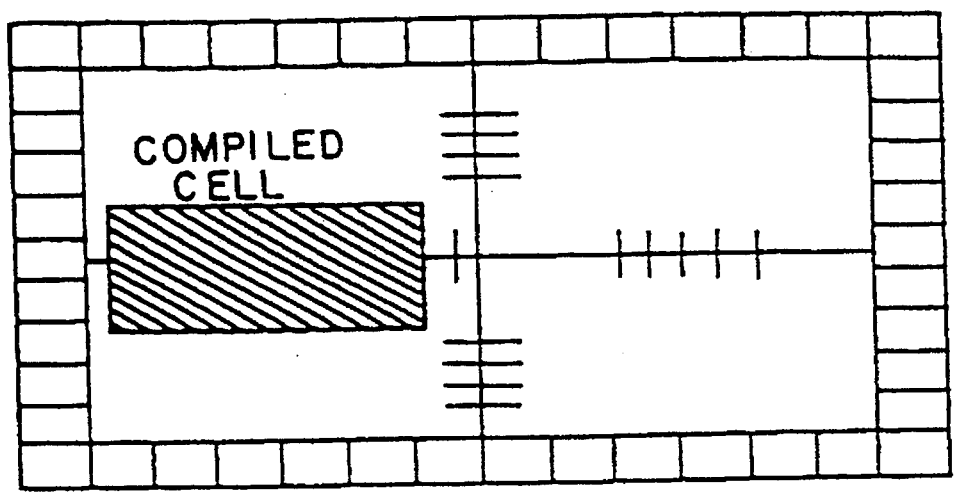
FIG. 28 shows the quartering mini-cut method (4)

Third, the quadratic mini-cut method has the advantage of providing a weight in a specified direction. Therefore, the cut size can be reduced for a smaller connection capacity when connection capacities are considerably different between the vertical and horizontal directions. This applies to the case where, as shown in FIG. 28, a cut line carries a compiled cell such as a RAM.

In performing the quadratic mini-cut method, it is desirable to level the congestion of each cut line (cut size on a cut line) to improve its connection rate, and it is also desirable to shorten the connection length to avoid the delay due to an inappropriate connection and to successfully realize a high-speed operation.

However, according to the conventional technologies, a solution cannot be obtained simply for the optimum cut size. Therefore, considering the connection length and the congestion of cut lines may further prevents the optimization of the cut size from being realized, and has been almost ignored.

When the quadratic mini-cut method is adopted, it is necessary, unlike the two-way mini-cut method, to consider the connection length and the congestion of each cut line because of a 4-block net and a 4-segment cut line.

When the mini-cut method executing program 2 first receives an initial cell placement and two cut lines for quadratic mini-cut, it starts performing the mini-cut method based on the initial cell placement. If the cut size has reached a local minimum state, then the mini-cut method executing program 2 terminates the process and notifies the stable net deleting program 3 of the execution result.

Figure 29:
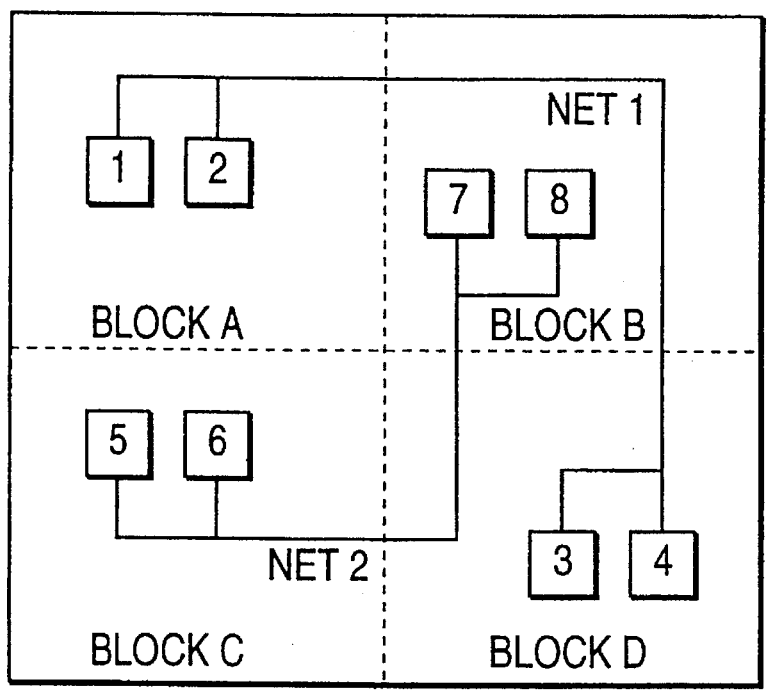
FIG. 29 shows an execution result of the quartering mini-cut method.
Figure 30:
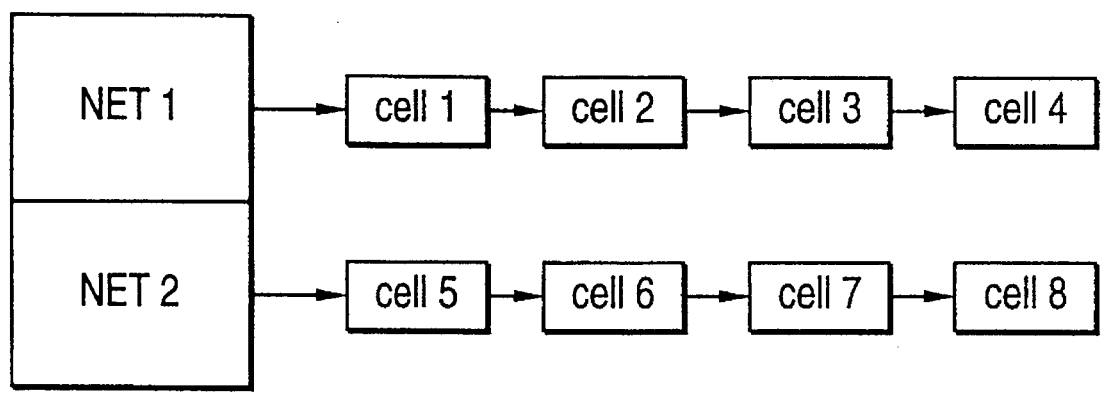
FIG. 30 is a cell list associated with FIG. 29.
Figure 31:
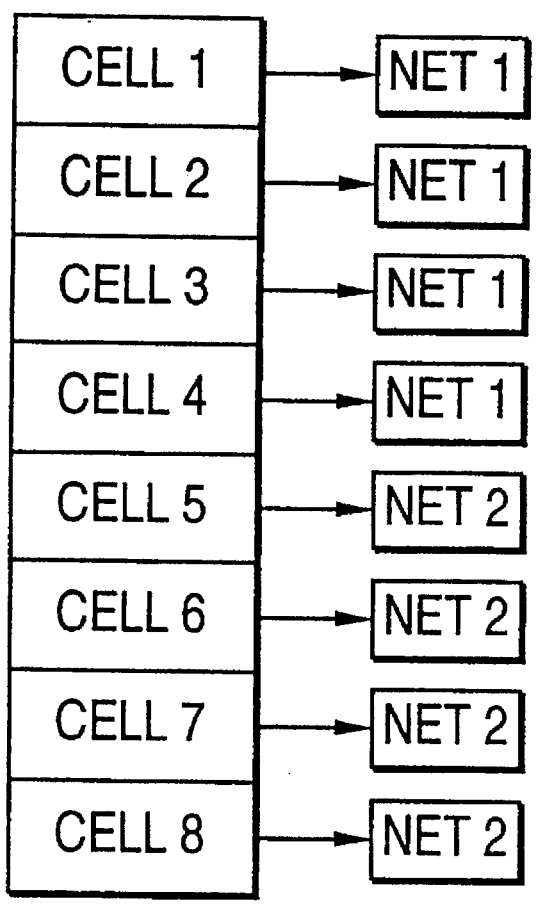
FIG. 31 is a net list associated with FIG. 29.
Figures 32, 42:
FIG. 32 shows a cell display information corresponding to the result shown in FIG. 29.
FIG. 42 shows a result of developing the cell placement information according to the quartering mini-cut method.

For example, if the cell placement shown in FIG. 29 has been output as a result of the execution of the mini-cut method, the mini-cut method executing program 2 notifies the stable net deleting program 3 of the cell list shown in FIG. 30 indicating the connection of each net to cells, the net list shown in FIG. 31 indicating the connection of each cell to a net, and cell placement information shown in FIG. 32 indicating each cell as being associated with a block to locate in.

Thus, upon receipt of the execution result from the mini-cut method executing program 2, the stable net deleting program 3 first detects the stable nets which have caused the local minimum state, and then stores the detection result in the variable staple flags.

Figure 33:
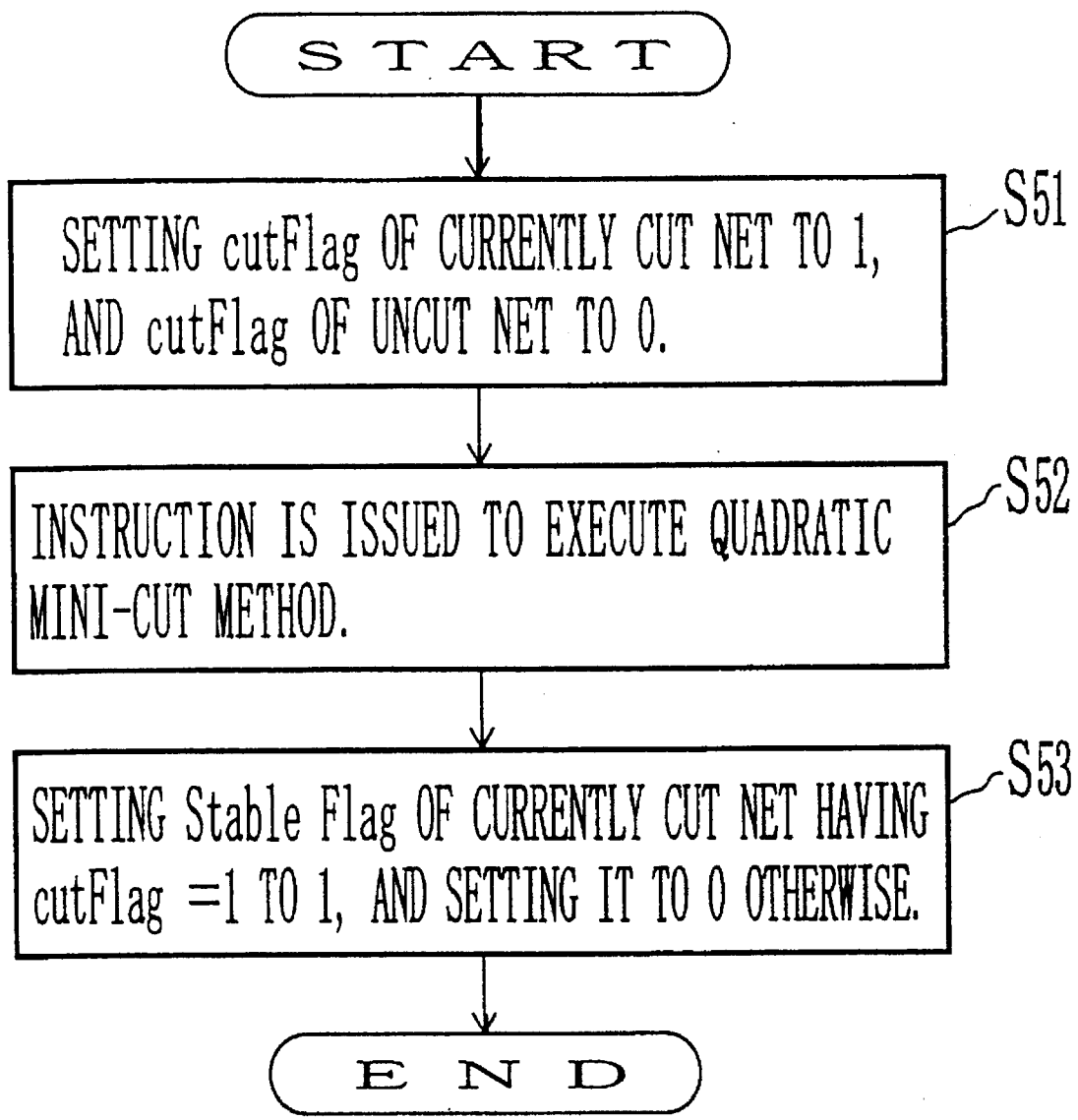
FIG. 33 is a flowchart of the processes (according to the quartering mini-cut method) of detecting a stable net according to the stable net deleting program.

FIG. 33 shows an embodiment of the process of detecting stable nets performed by the stable net deleting program 3.

That is, as shown in the flowchart shown in FIG. 33, the stable net deleting program 3 detects a net cut at the start of the process performed by the mini-cut method executing program 2 in step 51, stores the detection result in the variable cut flag as shown in FIG. 34, and activates the mini-cut method executing program 2 for performing the quadratic mini-cut method in step S52. It determines as a stable net at the end of the process of the mini-cut method executing program 2 the net whose cut state has been entered on the variable cut flag and which is also cut at the end of the process. Otherwise, it determines that it is not a stable net and stores the detection result in the variable stable flag in step S 53.

Thus, the stable net deleting program 3 determines that nets 1 and 2 are stable nets by performing the processes shown in FIG. 33 when it receives the execution result shown in FIG. 29, and stores the detection result in the variable stable flags shown in FIG. 35.

After storing the detection result of the stable nets in the variable stable flags, the stable net deleting program 3 unstabilizes the detected stable nets because the stable nets have caused the local minimum state.

The process performed to delete stable nets are the same as that shown in FIGS. 18, 19, and 20 when the connection length and the congestion are not considered except that there are the four blocks.

Figure 36:
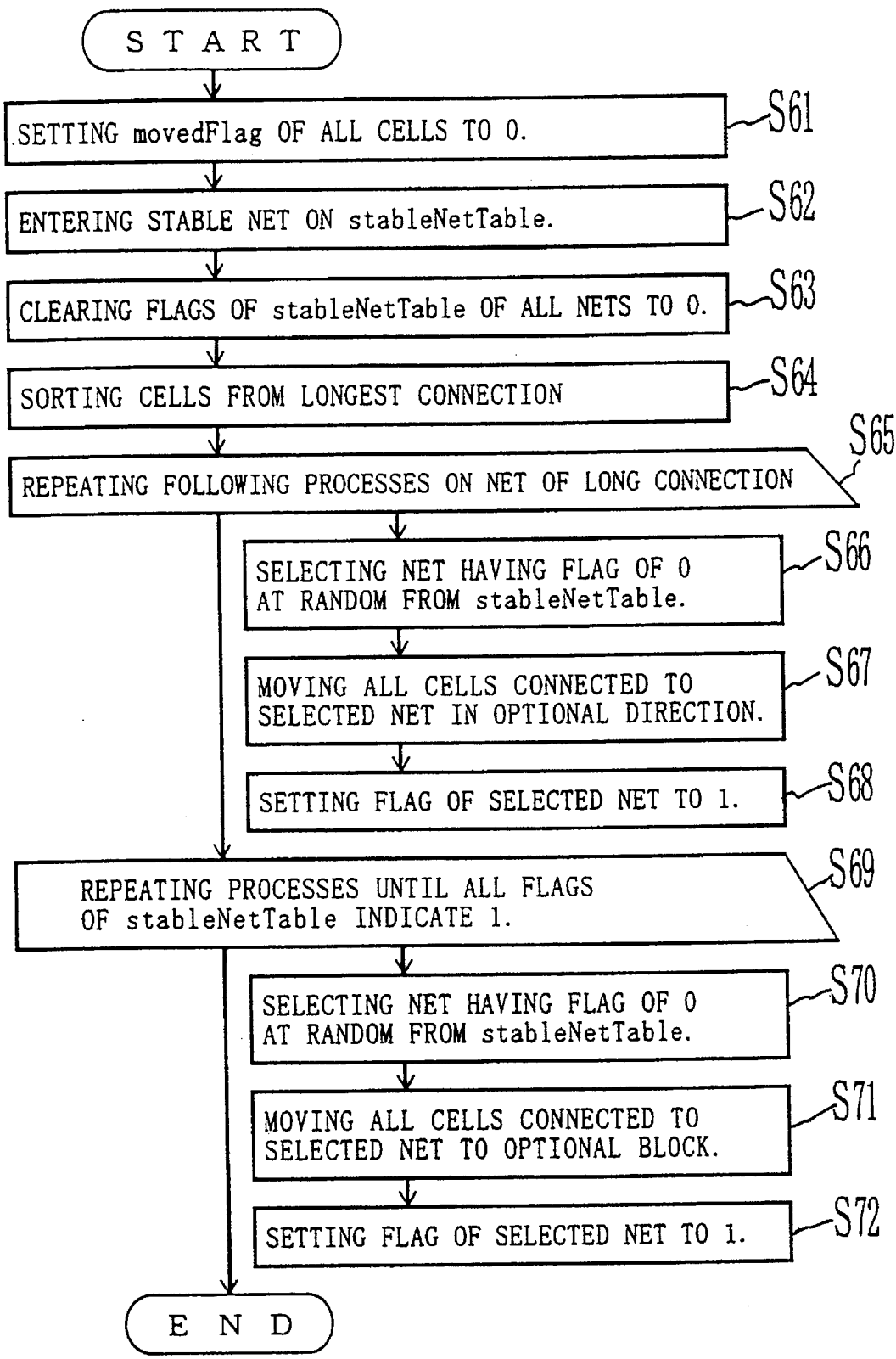
FIG. 36 is a flowchart (1) of the processes of deleting a stable net according to the stable net deleting program (in the quartering mini-cut method)

On the other hand, if the connection length is considered, the detected stable net can be unstabilized by performing the process shown in FIG. 36. If the congestion of a cut line is considered, the detected stable net can be unstabilized by performing the process shown in FIG. 37. The stable net deleting process performed by the stable net deleting program 3 is described below by referring to the processes.

If the connection length is considered, the stable net deleting program 3 first sets in step S61 all entries of the variable moved flag to a flag value of 0 when a stable net is detected as shown by the flowchart in FIG. 36. As described above, each entry of the variable moved flag (provided corresponding to a cell) indicates whether or not the cell has been moved. In step S61, a flag value of 0 is set to indicate no cells have been moved as shown in FIG. 38.

Then, in step S62, the name of the net entered as a stable net on the variable stable flag is entered on the variable stable net table. In step S63, all entries on the variable stable net table are set to 0. Each entry on the variable stable net table indicates whether or not the process has been completed on the stable net. In steps S62 and S63, the name of the stable net is entered on the variable stable net table and all entries are set to a flag value of 0 to indicate the entire stable net has not been processed as shown in FIG. 39.

Then, in step S64, the stable nets are sorted from longest to shortest. As described above, in the case of the quadratic mini-cut method, the cut size (number of traversed cut line segments) of each net corresponds to the connection length of each net. Accordingly, the stable nets are sorted from, for example, the largest cut size (longest connection) in step S64.

In step S65, an instruction is issued to repeatedly perform the processes in step S66 through S68 on a stable net partitioning a long connection.

That is, stable nets indicating a flag value of 0 are selected at random from the stable nets entered on the variable stable net table in step S66, and cells are moved such that all cells connected to the selected stable nets are put in a single block in step S67. Then, in step S68, the selected stable nets are set to the flag values of 1. The processes in steps S66 through S68 are repeatedly performed.

In performing the cell moving process in step S67 (as in the cell moving process in step S71 described later), a cell which has ever been moved before can be prohibited from being moved again as shown in FIG. 19, and the block area can be balanced with a total of cell areas as shown in FIG. 20.

Then, in step S65, upon confirmation of the completion of the process on stable nets partitioning a long connection, go to step S69, and the processes in step S70 through S72 are repeatedly performed until the flags of all entries on the variable stable net table indicate 1.

That is, stable nets indicating the flag value of 0 (stable nets having a short connection still remain) are selected at random from the stable nets entered on the variable stable net table in step S70, and cells are moved such that all cells connected to the selected stable nets are put in a single block in step S71. Then, in step S72, the selected stable nets are set to the flag values of 1. The processes in steps S70 through S72 are repeatedly performed.

In performing the cell moving process, a cell which has ever been moved before is prohibited from being moved again. Accordingly, a stable net having a longer connection is deleted by priority in step S36.

In this case, nets are deleted after dividing into those having a longer connection and the others. However, it is obvious that they can be deleted in the order from the net having the longest connection.

Figure 37:
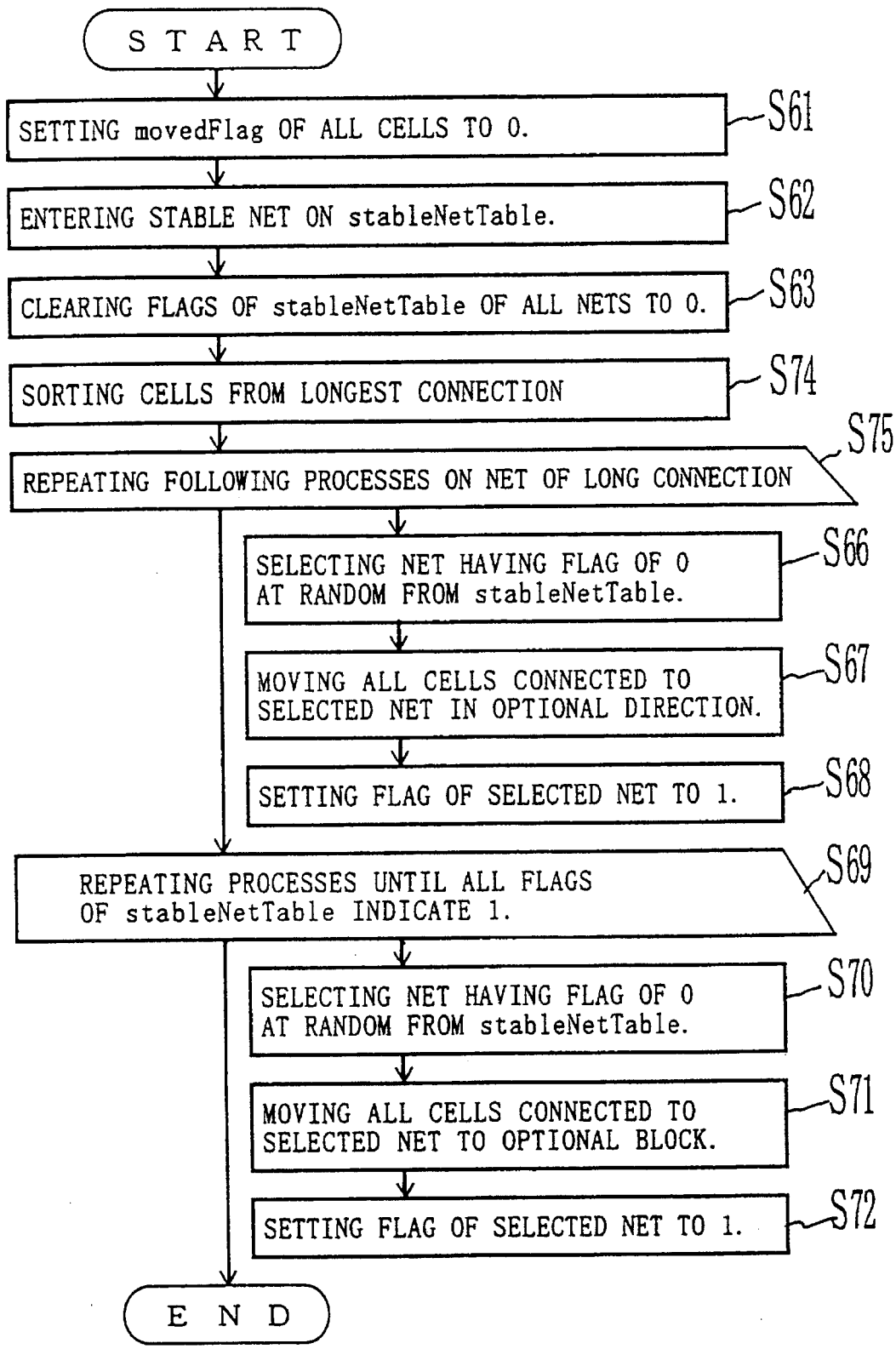
FIG. 37 is a flowchart (2) of the processes of deleting a stable net according to the stable net deleting program (in the quartering mini-cut method)
Figure 40:
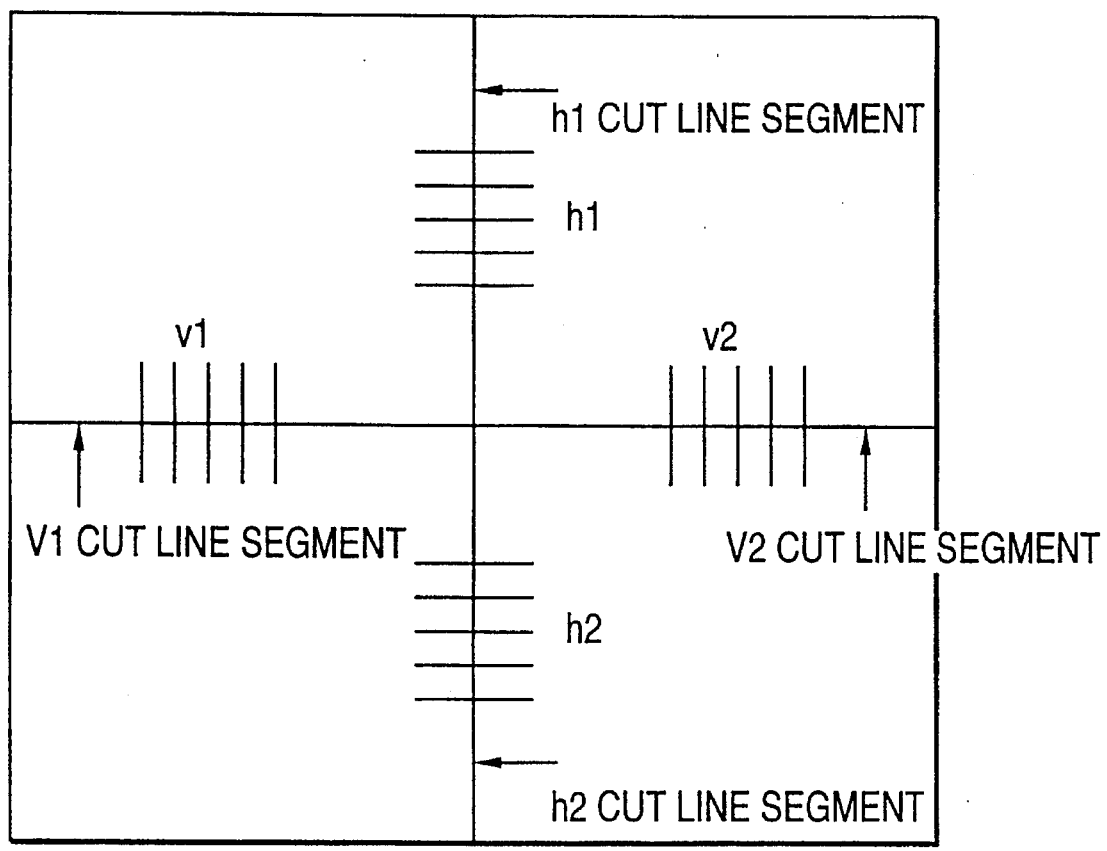
FIG. 40 shows the congestion of cut lines.

On the other hand, if the congestion in a cut line is considered, the stable net deleting program 3 performs the process shown in FIG. 37 upon detection of a stable net. The difference between the processes in FIGS. 36 and 37 is that a stable net having a longer connection is deleted by priority in the process shown in FIG. 36, while the congestion in four cut line segments is considered as shown in FIG. 40 and a stable net traversing a cut line in a higher congestion is deleted by priority in the process shown in FIG. 37. In FIG. 40, for example, $h_1$ is the number of nets traversing the upper segments.

In the flowchart in FIGS. 36 and 37, if a net has been cut at the start of the mini-cut method and is also being cut at the end of the mini-cut method, it is detected as a stable net as shown by the flowchart in FIG. 33. Additionally, the stable net condition can include a longer connection, a cut line in a higher congestion, etc.

Thus, upon receipt of the execution result of a local minimum state from the mini-cut method executing program 2, the stable net deleting program 3 detects a stable net which has caused the local minimum state according to the flowchart shown in FIG. 33. Then, it unstabilizes as much as possible the detected stable nets according to the flowcharts shown in FIGS. 18, 19, 20, 36, and 37.

Figure 41:
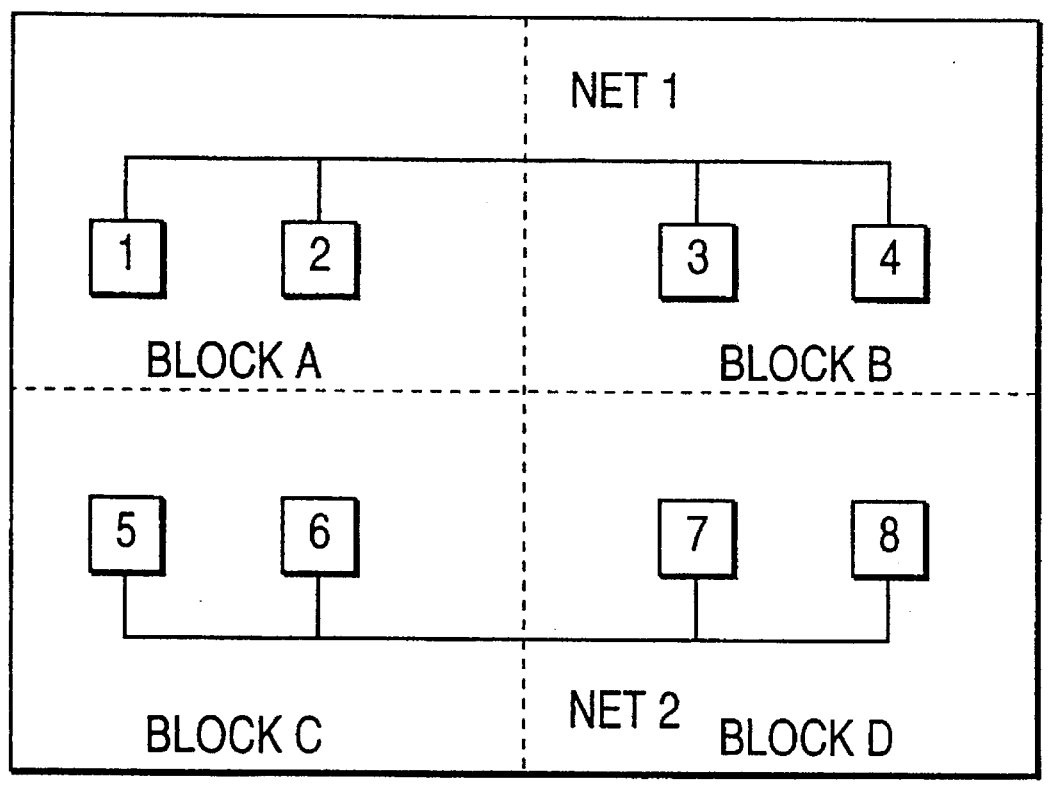
FIG. 41 shows a result of deleting a stable net according to the quartering mini-cut method.

When the stable net deleting program 3 receives an execution result as shown in FIG. 29 from the mini-cut method executing program 2, it retrieves stable nets 1 and 2 from the result and puts them in blocks A and B, and blocks C and D respectively. Thus, the stable net deleting program 3 develops the received cell/net information into the cell placement as shown in FIG. 41. That is, it changes the cell placement information received from the mini-cut method executing program 2 and shown in FIG. 32 into the data as shown in FIG. 42.

Upon completion of the development of the cell placement information, the stable net deleting program 3 instructs the mini-cut method executing program 2 to resume the mini-cut method using the updated cell placement information as new cell placement information.

When the mini-cut method executing program 2 receives the resume instruction from the stable net deleting program 3, it starts the mini-cut method again. It determines whether the cut size obtained by executing the mini-cut method indicates a local minimum state or satisfies a terminate condition. If a terminate condition is satisfied, the cell placement of the execution result of the mini-cut method is output. On the other hand, if a local minimum state is determined, the mini-cut method executing program 2 activates the stable net deleting program 3 again.

Thus, if the cut size reaches a local minimum state by executing the quadratic mini-cut method, then the integrated circuit cell placement device 1 detects stable nets which have caused the local minimum state, deletes the stable nets, and executes the mini-cut method again. By repeatedly performing the above described processes, the optimum cell placement can be determined for a given cut line.

According to the present invention as described above, if the cut size reaches a local minimum state by executing the quadratic mini-cut method, then stable nets which have caused the local minimum state are detected and deleted, and the mini-cut method is executed again. These processes are repeatedly performed to reach stable states with a smaller cut size than conventional technologies. Thus, an almost optimum stable state can be reached with a great possibility.

Then, stable nets having a longer connection or stable nets traversing a cut line having a higher congestion are deleted by priority. Furthermore, the stable nets are deleted after moving cells such that the block area are balanced with a total of cell areas. As a result, a cell placement can be determined as well-balanced in area with level congestion and short connections of nets.

Thus, according to the present invention, the optimum placement can be designed by determining the cell placement of an integrated circuit based on the mini-cut method.

What is claimed is:

1. An integrated circuit placement method for designing a cell placement of an integrated circuit by setting a cut line which divides the integrated circuit into a plurality of blocks and moving cells such that the cut size as a number of nets connecting the cells and traversing the cut line is minimized, said method comprising the steps of:

a) detecting stable nets, which have caused a local minimum state if the cut size has reached the local minimum state after executing a mini-cut method from the nets;

b) selecting all or a part of the detected stable nets and moving cells, connected to the selected stable nets and placed in different blocks, to either of the blocks; and d) detecting stable nets if it is determined that cut size cannot satisfy a terminate condition after executing the mini-cut method immediately following said step b), and for reactivating said step b).

2. The integrated circuit placement method according to claim 1, comprising the steps of detecting nets cut at a start of the mini-cut method and also cut at an end of the mini-cut method as stable nets.

3. The integrated circuit placement method according to claim 2, further comprising the steps of:

d) detecting the stable nets when the stable nets have a long connection when a quadratic mini-cut method of a division level higher than a two-way mini-cut method is performed; and e) selecting the stable nets having a long connection by priority in said step b).

4. The integrated circuit placement method according to claim 2, further comprising the steps of:

d) detecting the stable nets when the stable nets traverse a cut line of a higher congestion when a quadratic mini-cut method of a division level higher than a two-way mini-cut method is performed; and e) selecting the stable nets traversing a cut line of a higher congestion by priority in said step b).

5. The integrated circuit placement method according to claim 2, further comprising the steps of:

d) detecting the stable nets when the stable nets have a long connection and traverse a cut line of a higher congestion when a quadratic mini-cut method of a division level higher than a two-way mini-cut method is performed; and e) selecting the stable nets having a long connection and traversing a cut line of a higher congestion by priority in said step b).

6. The integrated circuit placement method according to claim 1, further comprising the steps of detecting the nets which are cut at an end of a process of the mini-cut method and have a number of connected cells as stable nets.

7. The integrated circuit placement method according to claim 6, further comprising the steps of:

d) detecting the stable nets when the stable nets have a long connection when a quadratic mini-cut method of a division level higher than a two-way mini-cut method is performed; and e) selecting the stable nets having a long connection by priority in said step b).

8. The integrated circuit placement method according to claim 6, further comprising the steps of:

d) detecting the stable nets when the stable nets traverse a cut line of a higher congestion when a quadratic mini-cut method of a division level higher than a two-way mini-cut method is performed; and e) selecting the stable nets traversing a cut line of a higher congestion by priority in said step b).

9. The integrated circuit placement method according to claim 6, further comprising the steps of:

d) detecting the stable nets when the stable nets have a long connection and traverse a cut line of a higher congestion when a quadratic mini-cut method of a division level higher than a two-way mini-cut method is performed; and e) selecting the stable nets having a long connection and traversing a cut line of a higher congestion in said step b).

10. The integrated circuit placement method according to claim 1, further comprising the step of detecting the nets which are cut at an end of a process of the mini-cut method and connected cells having many terminals as a stable net.

11. The integrated circuit placement method according to claim 10, further comprising the steps of:

d) detecting the stable nets when the stable nets have a long connection when a quadratic mini-cut method of a division level higher than a two-way mini-cut method is performed; and e) selecting the stable nets having a long connection as selected by said step b).

12. The integrated circuit placement method according to claim 10, further comprising the steps of:

d) detecting the stable nets when the stable nets traverse a cut line of a higher congestion when a quadratic mini-cut method of a division level higher than a two-way mini-cut method is performed; and e) selecting the stable nets traversing a cut line having a higher congestion as selected by said step b).

13. The integrated circuit placement method according to claim 10, further comprising the steps of:

d) detecting the stable nets when the stable nets have a long connection and traverse a cut line of a higher congestion when a quadratic mini-cut method having a division level higher than a two-way mini-cut method is performed; and e) selecting the stable nets having a long connection and traversing a cut line of a higher congestion as selected by said step b).

14. The integrated circuit placement method, according to claim 1, further comprising the step of moving the cells with a cell which has been prevented from being moved again in said step b).

15. The integrated circuit placement method, according to claim 1, further comprising the step of moving the cells such that an area of each block is balanced with a total of cell areas in said step b).

16. An integrated circuit placement method for designing a cell placement of an integrated circuit by setting a cut line which divides the integrated circuit into a plurality of blocks and moving cells such that the cut size as a number of nets connecting the cells and traversing the cut line is minimized, said method comprising the steps of:

a) performing a mini-cut method until the cut size reaches a stable state;
   b) determining whether the stable states are a local minimum state or satisfy a terminate condition;
   c) detecting, if a terminate condition is not satisfied, connections between the cells which have caused the local minimum state as stable nets;
   d) repeating a process of performing the mini-cut method until the cut size reaches a stable state after deleting the stable nets by moving the cells, in all or a part of the detected stable nets, connected to the stable nets in one block and another block so that the stable nets may not traverse the cut line; and
   e) determining a result of the mini-cut method as an optimum placement of the integrated circuit when the terminate condition is satisfied.

17. The integrated circuit placement method according to claim 16, further comprising the step of detecting nets cut at a start of the mini-cut method and also cut at an end of the mini-cut method as stable nets.

18. The integrated circuit placement method according to claim 16, further comprising the step of detecting nets which are cut at an end of a process of the mini-cut method and have a number of connected cells as stable nets.

19. The integrated circuit placement method according to claim 16, further comprising the step of detecting the nets which are cut at an end of a process of the mini-cut method and have connected cells having many terminals as stable nets.

20. The integrated circuit placement method, according to claim 16, further comprising the step of moving the cells with a cell which has been prevented from being moved again.

21. The integrated circuit placement method, according to claim 16, further comprising the step of moving the cells such that an area of each block is balanced with a total of cell areas in the block.

* * * * *

UNITED STATES PATENT AND TRADEMARK OFFICE
CERTIFICATE OF CORRECTION

PATENT NO. : 5,579,237
DATED : November 26, 1996
INVENTOR(S) : Toshiyuki SHIBUYA It is certified that error appears in the above-indentified patent and that said Letters Patent is hereby corrected as shown below:

Title page, Item [56] REFERENCES CITED

"5,189,784" should be --5,187,784--;

Title page, Item [56] OTHER PUBLICATIONS

"Yang et al., "Two-level partioning algorithm with stable performance"" should be --Yang et al., "Two-level partitioning algorithm with stable performance"--;

"Cheng et al., "An Improved Two-Way Partitioning Algorothm with Stable Performance"" should be --Cheng et al., "An Improved Two-Way Partitioning Algorithm with Stable Performance"--;

"Ball et al., "Fuzzy Partioning applied to VLSI-Floorplanning & Placement"" should be --Ball et al, "Fuzzy Partitioning applied to VLSI-Floorplanning & Placement"--.

Signed and Sealed this

Twenty-fifth Day of February, 1997

Attest:

BRUCE LEHMAN

*Attesting Officer*  *Commissioner of Patents and Trademarks*